(12) United States Patent
Arita et al.

(10) Patent No.: US 6,537,830 B1
(45) Date of Patent: Mar. 25, 2003

(54) METHOD OF MAKING FERROELECTRIC FET WITH POLYCRYSTALLINE CRYSTALLOGRAPHICALLY ORIENTED FERROELECTRIC MATERIAL

(75) Inventors: Koji Arita, Osaka (JP); Carlos A. Paz de Araujo, Colorado Springs, CO (US); Larry D. McMillan, Colorado Springs, CO (US); Masamichi Azuma, Shiga (JP)

(73) Assignees: Symetrix Corporation, Colorado Springs, CO (US); Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/533,204

(22) Filed: Mar. 23, 2000

Related U.S. Application Data

(63) Continuation-in-part of application No. 08/405,885, filed on Mar. 17, 1995, which is a continuation-in-part of application No. 07/965,190, filed on Oct. 23, 1992, now abandoned, which is a continuation-in-part of application No. 07/993,380, filed on Dec. 18, 1992, now Pat. No. 5,456,945.

(51) Int. Cl.[7] .............................................. H01L 21/00
(52) U.S. Cl. ........................ 438/3; 438/240; 438/800; 257/410; 257/411
(58) Field of Search ........................... 438/3, 240, 785, 438/800; 427/542, 558; 365/145; 257/410, 411; 425/126.3

(56) References Cited

U.S. PATENT DOCUMENTS

| | | | |
|---|---|---|---|
| 2,791,758 A | 5/1957 | Looney | |
| 4,888,630 A | 12/1989 | Paterson | |
| 5,028,455 A * | 7/1991 | Miller et al. | 427/126.3 |
| 5,146,299 A | 9/1992 | Lampe et al. | |
| 5,231,074 A | 7/1993 | Cima et al. | |
| 5,426,075 A * | 6/1995 | Perino et al. | 437/235 |
| 5,519,566 A | 5/1996 | Perino et al. | |
| 5,621,559 A * | 4/1997 | Thakoor et al. | 359/107 |
| 5,648,114 A | 7/1997 | Paz de Araujo et al. | |
| 5,888,296 A | 3/1999 | Ooms et al. | |
| 5,912,486 A | 6/1999 | Summerfelt | |
| 5,955,755 A | 9/1999 | Hirai et al. | |
| 6,054,331 A * | 4/2000 | Woo et al. | 438/3 |
| 6,117,691 A * | 9/2000 | Hsu et al. | 438/3 |
| 6,171,934 B1 * | 1/2001 | Joshi et al. | 438/649 |

FOREIGN PATENT DOCUMENTS

| | | |
|---|---|---|
| JP | 4-91428 | 3/1992 |
| JP | 11186523 | 7/1999 |
| WO | WO 96/29726 | 9/1996 |

OTHER PUBLICATIONS

Scott et al., "Integrated Ferroelectrics," Condensed Matter News, vol. 1 (No. 3), pp. 16–20 (1992).
Shu–Yau Wu, "A New Ferroelectric Memory Device, Metal–Ferroelectric– Semiconductor Transistor," Transactions On Electron Devices, vol. 21 (No. 8), pp. 499–504 (1974).
S. Y. Wu, "Memory Retention And Switching Behavior Of Metal–Ferroelectric–Semiconductor Transistors," Ferroelectrics, Gordon and Breach Science Publishers Ltd. (Great Britain), pp. 379–383 (1976).
Auciello et al., "The Physics of Ferroelectric Memories," Physics Today, American Institute of Physics (Woodbury, NY), vol. 51 (No. 7), pp. 22–27 (Jul., 1998).

* cited by examiner

*Primary Examiner*—Olik Chaudhuri
*Assistant Examiner*—Julio J. Maldonado
(74) *Attorney, Agent, or Firm*—Patton Boggs LLP

(57) ABSTRACT

A nondestructive read-out, nonvolatile ferroelectric field effect transistor ("FET") memory in an integrated circuit, containing a thin film of polycrystalline crystallographically oriented ferroelectric material. Preferably, the material is polycrystalline c-axis oriented layered superlattice material. More preferably, it is c-axis oriented strontium bismuth tantalate or strontium bismuth tantalum niobate.

34 Claims, 16 Drawing Sheets

METHOD OF MAKING FERROELECTRIC FET WITH POLYCRYSTALLINE CRYSTALLOGRAPHICALLY ORIENTED FERROELECTRIC MATERIAL

RELATED APPLICAITONS

This application is a CIP of Ser. No. 08/408,885 filed Mar. 17, 1995 which is a CIP of Ser. No. 07/965,190 filed Oct. 23, 1992 which is a CIP of Ser. No. 07/993,380 filed Dec. 18, 1992 now U.S. Pat. No. 5,456,945.

BACKGROUND OF THE INVENTION

1. Field of the Invention

This invention relates to ferroelectric field effect transistors, and more particularly to ferroelectric field effect transistors containing a thin film of crystallographically oriented ferroelectric material.

2. Statement of the Problem

It has been known since at least the 1950's that if a practical ferroelectric memory could be made, it would provide a fast, dense, non-volatile memory that could be operated at relatively low voltages. See Orlando Auciello et al., "The Physics of Ferroelectric Memories", *Physics Today*, July 1998, pp. 22–27. The principal type of ferroelectric memory being explored today is the non-volatile ferroelectric random access memory or NVFRAM. Ibid. A disadvantage of the NVFRAM is that, in the process of reading it, the information it holds is destroyed and, therefore, the read function must be followed by a rewrite function.

It has been postulated for at least 40 years, however, that it may be possible to design a nonvolatile, nondestructive read-out ("NDRO") memory in which the memory element is a single ferroelectric field effect transistor ("FET"), thereby reducing some of the complexity of conventional ferroelectric memory architecture and function. See U.S. Pat. No. 2,791,758 issued to D. H. Looney on May 7, 1957; Shu-Yau Wu, "A New Ferroelectric Memory Device, Metal-Ferroelectric-Semiconductor Transistor", in *IEEE Transactions On Electron Devices*, pp. 499–504, August 1974; S. Y. Wu, "Memory Retention and Switching Behavior Of Metal-Ferroelectric-Semiconductor Transistors", in Ferroelectrics, Vol. 11, pp. 379–383, 1976; and J. F. Scott, C. A. Paz de Araujo, and L. D. McMillan, "Integrated Ferroelectrics", in *Condensed Matter News*, Vol.1, No.3, pp. 15–20,1992. Because the ferroelectric memory effect measured in the devices of Wu was only a temporary, single state effect rather than a long lived two state effect, it has been generally believed that this effect was a carrier injection effect rather than an effect due to ferroelectric switching. See U.S. Pat. No. 5146,299 issued to Donald R. Lampe, Samaar Sinharoy, Shu Y. Wu, et al. on Sep. 8, 1992, col. 1, line 63–col. 2, line 5. Thus, up to the time of the present invention, the ferroelectric FET memory has been only a theoretical concept, and no actual memory devices were built.

The primary problem in making ferroelectric FETs is one of insufficient voltage for switching the polarization in the ferroelectric material. This problem can be understood by considering an exemplary ferroelectric FET structure of a so-called metal-ferroelectric-semiconductor FET ("MFS-FET"), in which a ferroelectric oxide is formed on the semiconductor substrate, and the metal gate electrode is located on the ferroelectric oxide. When such a structure is formed, oxide from the ferroelectric interacts with the semiconductor substrate, typically silicon, and forms a thin semiconductor oxide layer between the ferroelectric material and the semiconductor, typically, silicon dioxide. The ferroelectric thin film and the semiconductor oxide layer may be viewed as two capacitors in series. The dielectric constant of the ferroelectric thin film (usually 400–1000) is much higher than the dielectric constant of typical semiconductor oxides, which is usually about 3–5. As a result, most of the voltage drop occurs across the low dielectric constant semiconductor oxide, and a high operational voltage is required to switch the polarization of the ferroelectric thin film, typically, about 15 volts. This can lead to electrical breakdown of the ferroelectric material, semiconductor oxide, and other materials in the circuit. Further, a high operational voltage in excess of 3–5 volts renders the device incompatible with conventional integrated circuit art.

Another problem encountered is that a high leakage current in the ferroelectric thin films of the prior art makes the materials poorly suited for use in a nonvolatile memory since the information-storing polarization charge slowly dissipates.

One attempt to solve the above problem has been the growth of single ferroelectric crystals directly on a semiconductor substrate, such as sapphire. See U.S. Pat. No. 5,146,299 issued to Donald R. Lampe et al. referenced above. However, single crystal films have coercive fields that are too high to make a useful low-voltage memory. See Auciello et al., supra, p. 26, FIG. 4.

Thus, the high dielectric constant and high leakage current of ferroelectrics present significant obstacles to the use of ferroelectric FETs as integrated circuit memories.

SOLUTION

The invention solves the problems described above by providing a novel ferroelectric FET device containing a thin film of polycrystalline, crystallographically oriented ferroelectric material, as well as a method of making such devices.

A device in accordance with the invention preferably is a ferroelectric FET containing a polycrystalline thin film of ferroelectric layered superlattice material having c-axis orientation; for example, c-axis oriented strontium bismuth tantalate having a stoichiometric formula $SrBi_2Ta_2O_8$. Nevertheless, the oriented ferroelectric material can be formed of other metal oxides; for example, oriented polycrystalline $ABO_3$-type perovskites. Oriented $ABO_3$-type metal oxide perovskites include, but are not limited to titanates (e.g., $BaTiO_3$, $SrTiO_3$, $PbTiO_3$, $PbZrTiO_3$) and niobates (e.g., KNbO3). The oriented polycrystalline ferroelectric material may also be a non-oxide metal compound, such as a metal fluoride, or a crystallographically oriented nonmetallic organic compound.

The polycrystalline crystallographically oriented ferroelectric materials have a significantly lower dielectric constant and lower leakage current while retaining high polarizability and low coercive voltage. Thus, the ferroelectric FETs made with the polycrystalline crystallographically oriented material have a relatively low switching voltage while retaining the advantageous non-destructive read out properties of ferroelectric FETs.

In accordance with the invention, the thin film of polycrystalline crystallographically oriented ferroelectric material may be applied using any number of techniques for applying thin films in integrated circuits. Preferably, metal organic precursors suitable for metal organic decomposition ("MOD") techniques of thin film deposition are used. MOD methods enable convenient and accurate control of precursor concentrations. Preferably, a liquid source chemical deposition method is used such as misted deposition or chemical vapor deposition ("CVD"), or a spin-on or dipping method may be used instead.

In preferred embodiments of the invention, the write bias is applied between the substrate and the FET gate. Preferably, the ferroelectric FET memory cell is read by sensing the source/drain current when a voltage difference is placed across the source and drain.

An effective method for fabricating a ferroelectric FET memory in accordance with the invention is the use of UV radiation during treatment of the ferroelectric thin film to enhance c-axis orientation.

The invention not only provides a simple and dense ferroelectric memory having low leakage current, good fatigue resistance, and relatively low switching voltage, but also provides one that can be manufactured easily. Numerous other features, objects and advantages of the invention will become apparent from the following description when read in conjunction with the accompanying drawings.

DETAILED DESCRIPTION OF THE PREFERRED EMBODIMENT

1. Introduction

It should be understood that FIGS. 1, 3, 4, 6, 7, 27, 28 depicting sections of integrated circuit devices are not meant to be actual plan or cross-sectional views of any particular portion of an actual integrated circuit device. In the actual devices, the layers will not be as regular and the thicknesses may have different proportions. The figures instead show idealized representations which are employed only to depict embodiments of the invention more clearly and fully than would otherwise be possible.

Figure 1:
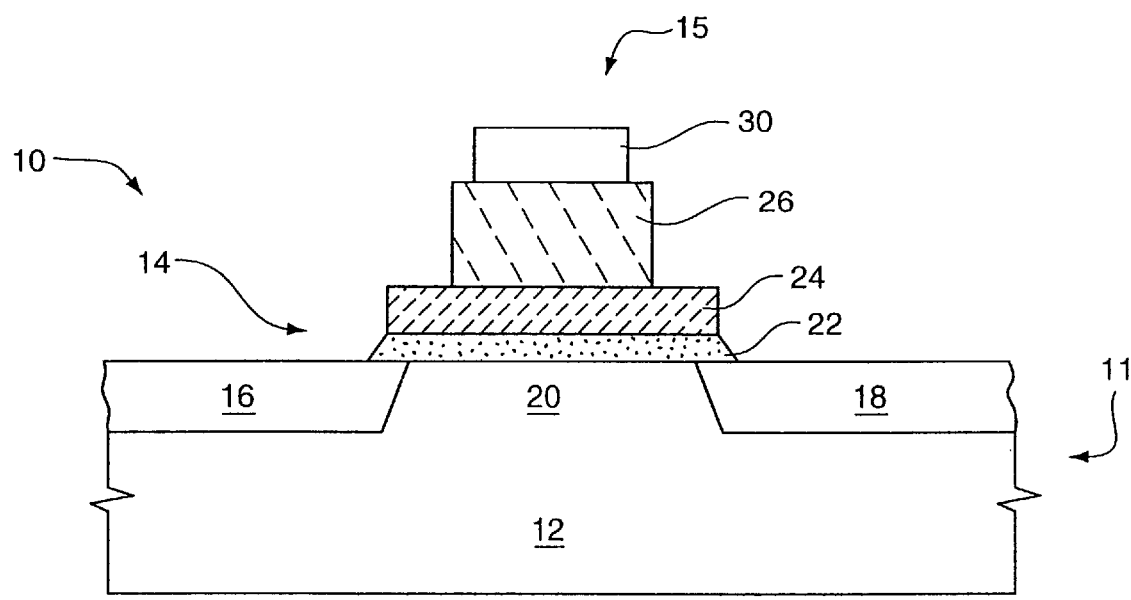
FIG. 1 shows a cross-sectional view of a portion of a ferroelectric FET memory having a thin film of polycrystalline crystallographically oriented ferroelectric material in accordance with a preferred embodiment of the invention.

FIG. 1 shows a cross-sectional view of a portion of a ferroelectric FET memory 10 in accordance with the preferred embodiment of the invention. The ferroelectric FET memory 10 is formed on a wafer 11, comprising a standard semiconductor material 12, preferably a p-100 silicon material. A semiconductor substrate 14 comprises a highly doped source region 16 and a highly doped drain region 18, which are formed about a doped channel region 20. Doped source region 16, drain region 18 and channel region 20 are preferably n-type doped regions. Semiconductor substrate 14 typically also includes a semiconductor oxide 22, located usually above channel region 20, but which can extend beyond channel region 20 to cover parts of source region 16, drain region 18 and other parts of semiconductor material 12. Typically, oxide 22 is a semiconductor oxide that is formed from the semiconductor material 12 during high temperature process steps. When the semiconductor material 12 is silicon, then semiconductor oxide 22 comprises silicon dioxide. Preferably, an optional interface insulator layer 24 is disposed on semiconductor substrate 14 above channel 20, usually on semiconductor oxide 22. A ferroelectric thin film 26 comprising polycrystalline crystallographically oriented ferroelectric material in accordance with the invention is located above semiconductor oxide 22 and channel region 20, usually either on semiconductor oxide 22 or on interface insulator layer 24, if present. Gate electrode 30 is formed above ferroelectric thin film 26, usually on ferroelectric thin film 26. Semiconductor substrate 14, including source region 16, drain region 18, channel region 20, and semiconductor oxide 22, together with interface insulator layer 24, ferroelectric thin film 26 and gate electrode 30 form ferroelectric FET memory cell 15, which generally is a portion of a multicell ferroelectric memory 10. Typically, memory 10 is covered by an interlayer dielectric ("ILD"), comprising a glasseous oxide, preferably a boron-doped phosphosilicate glass ("BPSG"). For purposes of simplicity and clarity, the ILD and some other structural elements and insulating layers are not shown because they are well-known in the art.

With respect to FIG. 1, optional interface insulator layer 24 typically comprises a dielectric metal oxide, such as $CeO_2$, $ZrO_2$, $Y_2O_3$, $(Ce_{1-x}Zr_x)O_2$, where $0 \leq x \leq 1$, preferably $(Ce_{0.1}Zr_{0.9})O_2$, but it may also be any dielectric material that is compatible with the other integrated circuit materials.

Ferroelectric thin film 26 comprises a polycrystalline crystallographically oriented ferroelectric material, preferably c-axis oriented polycrystalline layered superlattice material, and most preferably, c-axis oriented strontium bismuth tantalate. Nevertheless, the ferroelectric material contained in the ferroelectric thin film of the invention can be made of other oriented metal oxides; for example, oriented $ABO_3$-type perovskites. The ferroelectric material may also be a non-oxide metal compound, such as a metal fluoride, or a nonmetallic organic compound.

U.S. Pat. No. 5,519,234, issued May 21, 1996 to Araujo et al., incorporated herein by reference, discloses that polycrystalline layered superlattice compounds, such as strontium bismuth tantalate (SBT), have excellent properties in ferroelectric applications as compared to the best prior art materials and have good polarizability and good fatigue resistance. They also have relatively low leakage currents, but not as low as would be desirable for highly dense memories utilizing very thin ferroelectric films. However, these materials also have high dielectric constants which result in high switching voltage requirements when they are used in ferroelectric FETs.

The layered superlattice materials may be summarized generally under the formula:

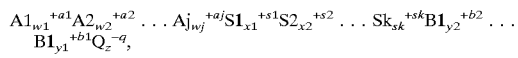

where A1, A2 . . . Aj represent A-site elements in the perovskite-like structure, which may be elements such as strontium, calcium, barium, bismuth, lead, and others; S1, S2 . . . Sk represent superlattice generator elements, which usually is bismuth, but can also be materials such as yttrium, scandium, lanthanum, antimony, chromium, thallium, and other elements with a valence of +3; B1, B2 . . . Bl represent B-site elements in the perovskite-like structure, which may be elements such as titanium, tantalum, hafnium, tungsten, niobium, zirconium, and other elements; and Q represents an anion, which generally is oxygen but may also be other elements, such as fluorine, chlorine and hybrids of these elements, such as the oxyfluorides, the oxychlorides, etc. The superscripts in formula (1) indicate the valences of the respective elements. For example, if Q is oxygen, then q=2. The subscripts indicate the number of moles of the material in a mole of the compound, or in terms of the unit cell, the number of atoms of the element, on the average, in the unit cell. The subscripts can be integer or fractional. That is, formula (1) includes the cases where the unit cell may vary throughout the material, e.g. in $SrBi_2(Ta_{0.75}N_{0.25})_2O_9$, on the average, 75% of the B-sites are occupied by a tantalum atom and 25% of the B-sites are occupied by a niobium atom. If there is only one A-site element in the compound, then it is represented by the "A1" element and w2 . . . wj all equal zero. If there is only one B-site element in the compound, then it is represented by the "B1" element, and y2 . . . y1 all equal zero, and similarly for the superlattice generator elements. The usual case is that there is one A-site element, one superlattice generator element, and one or two B-site elements, although formula (1) is written in the more general form since the invention is intended to include the cases where either of the sites and the superlattice generator can have multiple elements. The value of z is found from the equation:

$$(a1w1 + a2w2 \ldots + ajwj) + (s1x1 + s2x2 \ldots + skxk) + (b1y1 + b2y2 \ldots + blyl) = qz. \quad (2)$$

Formula (1) includes all three of the Smolenskii type compounds discussed in U.S. Pat. No. 5,519,234, issued May 21, 1996 to Araujo et al., which is hereby incorporated by reference as if fully incorporated herein.

The three general types of Smolenskii compounds are:

(I) compounds having the formula $A_{m-1}S_2M_mO_{3m+3}$, where $A=Bi^{3+}$, $Ba^{2+}$, $Sr^{2+}$, $Ca^{2+}$, $Pb^{2+}$, $K^+$, $Na^+$ and other ions of comparable size; $S=Bi^{3+}$; and $M=Ti^{4+}$, $Nb^{5+}$, $Ta^{5+}$, $Mo^{6+}$, $W^{6+}$, $Fe^{3+}$ and other ions that occupy oxygen octahedra;

(II) compounds having the formula $A_{m+1}M_mO_{3m+1}$, including compounds such as strontium titanates $Sr_2TiO_4$, $Sr_3Ti_2O_7$ and $Sr_4Ti_3O_{10}$; and (III) compounds having the formula $A_mM_mO_{3m+2}$, including compounds such as $Sr_2Nb_2O_7$, $La_2Ti_2O_7$, $Sr_5TiNb_4O_{17}$, and $Sr_6Ti_2Nb_4O_{20}$.

Smolenskii pointed out that the perovskite-like layers may have different thicknesses, depending on the value of m.

The layered superlattice materials do not include every material that can be fit into formula (1), but only those which spontaneously form themselves into polycrystalline structures with distinct alternating layers during crystallization. This spontaneous crystallization is typically assisted by thermally treating or annealing the mixture of ingredients. The enhanced temperature facilitates ordering of the superlattice-forming moieties into thermodynamically favored structures, such as perovskite-like octahedra. The term "superlattice generator elements" as applied to S1, S2 ... Sk, refers to the fact that these metals are particularly stable in the form of a concentrated metal oxide layer interposed between two perovskite-like layers, as opposed to a uniform random distribution of superlattice generator metals throughout the layered superlattice material. In particular, bismuth has an ionic radius that permits it to function as either an A-site material or a superlattice generator; but bismuth, if present in amounts less than a threshold stoichiometric proportion, will spontaneously concentrate as a non-perovskite-like bismuth oxide layer.

Layered superlattice materials include mixed layered perovskite-like materials, which have different types of oxygen octahedra structures. For example, a first oxygen octahedra layer having a thickness of one octahedral may be separated by a bismuth oxide layer from an oxygen octahedra layer having a thickness of two octahedra. The mixed materials may also include a mixture of layers having respective thicknesses of two and three octahedra, or three and four octahedra.

A balanced general stoichiometric formula for strontium bismuth tantalum niobate is:

$$SrBi_2(Ta_{1-x}Nb_x)_2O_9, \quad (3)$$

wherein $0 \leq x \leq 1$. A general "non-stoichiometric" formula for strontium bismuth tantalum niobate can be written as:

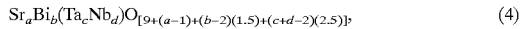

$$Sr_aBi_b(Ta_cNb_d)O_{[9+(a-1)+(b-2)(1.5)+(c+d-2)(2.5)]}, \quad (4)$$

where the respective subscript values are positive and typically are in the ranges $0.8 \leq a \leq 1$, $2 \leq b \leq 2.3$, and $2 \leq (c+d) \leq 2.3$.

Formula (3) corresponds to the general formula (1) wherein the A-site metal is strontium, the S-site metal (i.e., superlattice generator) is bismuth, the B-site metals are niobium and tantalum, and z=9. Formula (3) corresponds more specifically to the Smolenskii formula of type 1, where the A-site metal is strontium, the S-site metal is bismuth, the M-site metals are niobium and tantalum, and m=2. Formula (4) corresponds to formula (3), except that it provides for additional, nonstoichiometric amounts of A-, S- and B-site elements.

The thin film of polycrystalline oriented ferroelectric material of the invention preferably has a thickness in the range of 20 nanometers (nm) to 600 nm, and more preferably in the range of from 40 nm to 400 nm, and further preferably in the range of from 40 nm to 250 nm.

Figure 2:
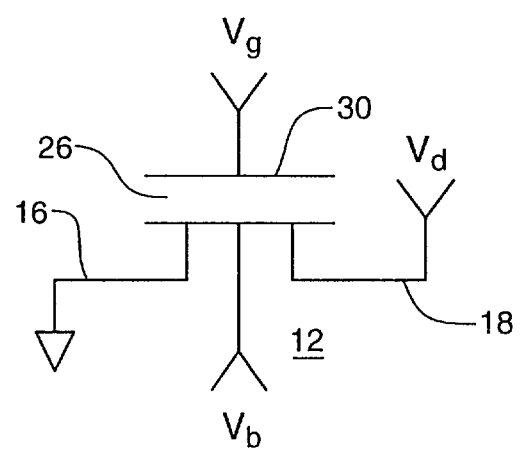
FIG. 2 shows the equivalent circuit for the memory of FIG. 1.

FIG. 2 shows the equivalent circuit for the preferred memory 10 of FIG. 1. In the preferred embodiment, source 16 is held at ground, and a bias voltage, Vb, used to select and deselect the cell is applied to the substrate 12. A drain bias voltage, Vd, is applied to drain 18 in the read process, and a gate bias voltage, Vg, is applied to gate electrode 30 to write to the cell.

Figure 3:
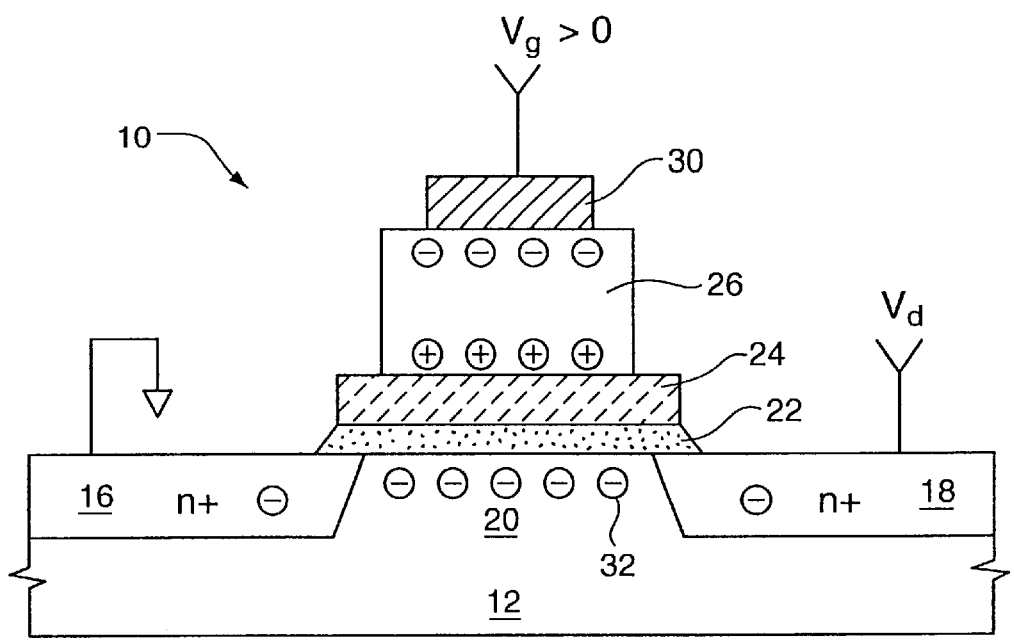
FIG. 3 illustrates the state of polarization of the ferroelectric thin film and the resulting electronic state of the channel region in the ferroelectric FET of FIG. 1 for an arbitrarily selected binary "1" state.
Figure 4:
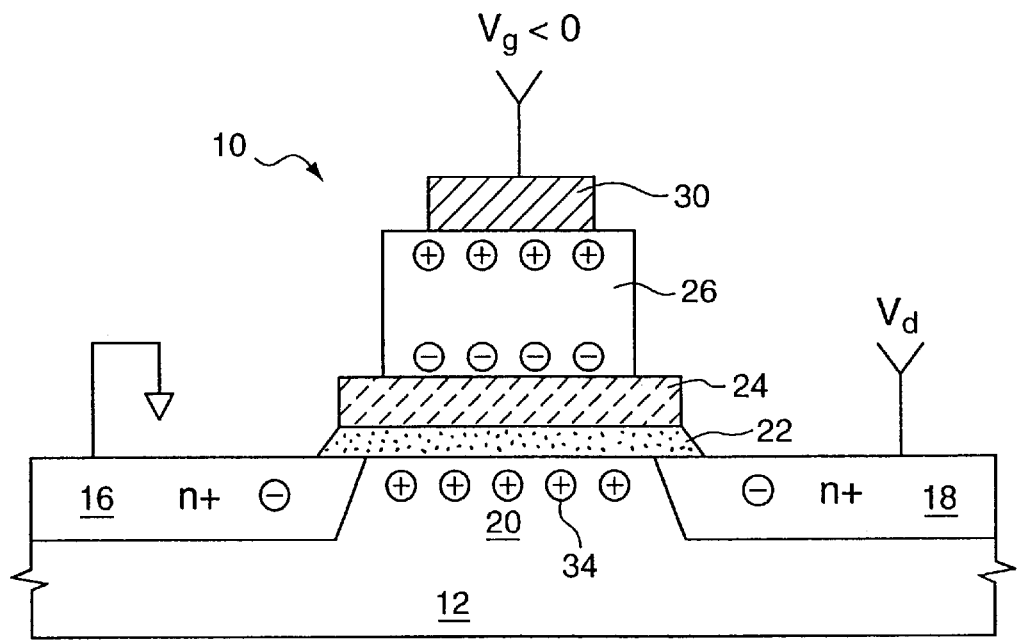
FIG. 4 illustrates the state of polarization of the ferroelectric thin film and the resulting electronic state of the channel region in the ferroelectric FET of FIG. 1 for an arbitrarily selected binary "0" state.

FIG. 3 illustrates the state of polarization of the ferroelectric thin film 26 and the resulting electronic state of channel region 20 for an arbitrarily selected binary "1" state, while FIG. 4 illustrates the state of polarization of the ferroelectric thin film 26 and the resulting state of channel region 20 for the "0" state. For the sake of clarity, ILD layers are not shown in these figures. In these figures, the circles in channel region 20 with minus signs, such as 32, represent electrons; the circles with plus signs, such as 34, represent positive holes. As shown in FIG. 3, if a positive write bias (or "switching") voltage, $V_g$, is applied to gate 30, then the resulting electric field exerted on ferroelectric thin film 26 causes ferroelectric thin film 26 to be polarized as shown, even after the switching voltage and field are no longer applied. The remanent polarization in ferroelectric thin film 26, as depicted in FIG. 3, exerts an electric field through interface insulator layer 24 and semiconductor oxide 22 into channel region 20, attracting electrons into channel region 20, and thereby causing an increase of free electrons available for conduction of electric current. As a result, when drain voltage, $V_d$, is applied to drain region 18 in a read operation, a current sensor senses high current across channel region 20, and reads a binary "1" state. When, as depicted in FIG. 4, a negative $V_g$ is applied in the write operation, then the resulting remanent polarization in ferroelectric thin film 26 repels current-carrying electrons from channel region 20, and the resulting low current is sensed as the binary "0" state when $V_d$ is applied in a read operation. The write bias voltage, $V_g$, and the read bias voltage, $V_d$, are typically in the range of 3–5 volts. As known in the art, a similar analysis can be made for p-type materials, except that in that case the carriers are positively charged holes.

2. The Fabrication Process

The word "substrate" is often used ambiguously in the art. It can mean the underlying wafer 11 on which an integrated circuit is formed, as well as any object on which a thin film layer is deposited. In this disclosure, "substrate" shall mean the object to which the layer of interest is applied; for example, when we are talking about a ferroelectric thin film, such as thin film 26 in FIG. 1, the substrate includes the elements 12, 16, 18, 20, 22 and 24 on which the ferroelectric thin film is formed. The term "semiconductor substrate" is more specific than substrate. As used herein, "semiconductor substrate 14" refers to those elements of the circuit having origins in the original semiconductor material of the starting wafer, such as from the p-100 crystalline silicon material of FIG. 1. Thus, in the example of the structure of FIG. 1, "semiconductor substrate 14" includes elements 12, 16, 18, 20 and 22.

The term "thin film" is used herein as it is used in the integrated circuit art. Generally, it means a film of less than a micron in thickness. The crystallographically oriented ferroelectric thin film 26 may have a thickness in the range of 20 nm to 600 nm, preferably in the range 40 nm to 250 nm. These thin films of the integrated circuit art should not be confused with the layered materials of the macroscopic capacitor art, which are formed by a wholly different process that is incompatible with the integrated circuit art.

In the art, the word "precursor" can mean a solution containing one metal which is mixed with other "precursors" to form intermediate precursors or final precursors, or it may refer to a final precursor mixture, that is, the solution to be applied to the substrate. In this disclosure, the first type of precursor is usually referred to as an "initial precursor" or designated specifically; for example, a "strontium precursor". The precursor as applied to the substrate is usually referred to as a "final precursor", "precursor mixture", or simply "precursor". In any case, the meaning is usually clear from the context.

The term "stoichiometric" herein may be applied to both a solid film of a material or to the precursor for forming a material. When it is applied to a solid thin film, it refers to a formula which shows the actual relative amounts of each element in a final solid thin film. When applied to a precursor, it indicates the molar proportion of metals in the precursor. A "balanced" stoichiometric formula is one in which there is just enough of each element to form a complete crystal structure of the material with all sites of the crystal lattice occupied, though in actual practice there always will be some defects in the crystal at room temperature. For example, both $SrBi_2(TaNb)O_9$ and $SrBi_2Ta_2O_9$ are balanced stoichiometric formulae. In contrast, a precursor for strontium bismuth tantalate in which the molar proportions of strontium, bismuth, and tantalum are 0.9, 2.18, and 2.0, respectively, is represented herein by the unbalanced "stoichiometric" formula $Sr_{0.9}Bi_{2.18}Ta_2O_9$, since it contains excess bismuth and deficient strontium relative to the B-site element tantalum. In this disclosure, an "excess" amount of a metallic element means an amount greater than required to bond with the other metals present to make a completed crystalline structure of the desired material, with all atomic sites occupied and no amount of any metal left over. A "deficient" amount of a metallic element means an amount less than required to bond with the other metals if the other metals were present in stoichiometrically balanced amounts.

Terms of orientation herein, such as "above", "top", "upper", "below", "bottom" and "lower", mean relative to semiconductor substrate 14. That is, if a second element is "above" a first element, it means it is farther from semiconductor substrate 14; and if it is "below" another element then it is closer to semiconductor substrate 14 than the other element. Terms such as "above" and "below" do not, by themselves, signify direct contact. However, terms such as "on" or "onto" do signify direct contact of one layer with an underlying layer.

The long dimension of semiconductor substrate 14 in FIG. 1 defines a plane that is considered to be a "horizontal" plane herein, and directions perpendicular to this plane are considered to be "vertical". The terms "lateral" or "laterally" refer to the direction of the flat plane of semiconductor substrate 14, that is, parallel to the horizontal direction.

Figure 5:
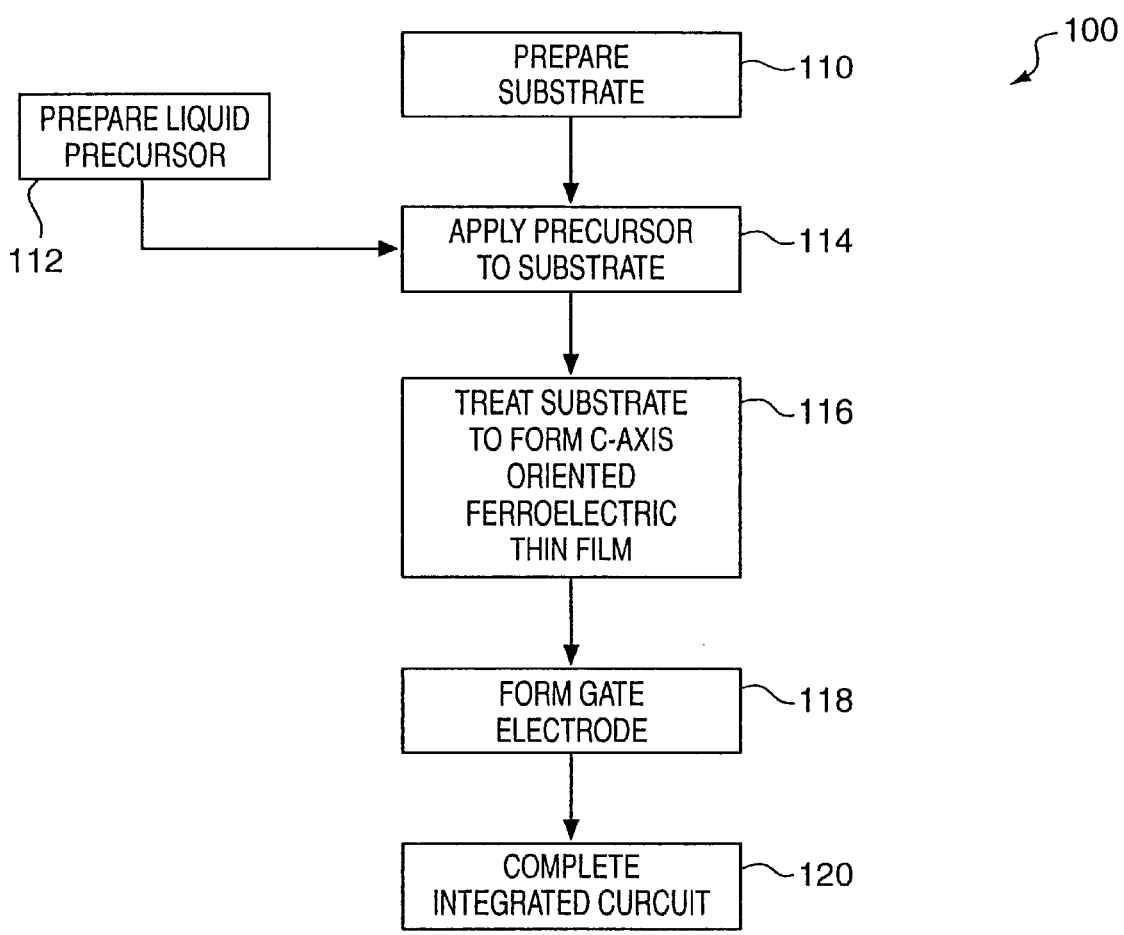
FIG. 5 is a flow chart showing the steps of a generalized liquid source deposition process for fabricating a ferroelectric FET memory having a thin film of crystallographically oriented ferroelectric material in accordance with an embodiment of the invention.

FIG. 5 is a flow chart showing the steps of a generalized liquid source fabrication process 100 for fabricating a ferroelectric FET memory in accordance with an embodiment of the invention. The fabrication methods disclosed here are discussed in relation to the structure of ferroelectric FET memory 10, depicted in FIG. 1. It is understood that although the fabrication process 100 using an MOD precursor is a preferred technique forming a ferroelectric FET containing a thin film of crystallographically oriented ferroelectric material, othertechniques for depositing and crystallizing ferroelectric thin films may be used.

In substrate preparation steps 110, wafer 11 is cleaned to remove contaminants, preferably by dipping the wafer into $H_2SO_4$ for 30 minutes. Then the wafer is dipped into 10:1 buffered HF solution for five minutes, which removes any natural oxide that may have formed on the wafer. A field oxide layer (not shown) is grown in a furnace, preferably to a thickness of 500 nanometers (nm). The source/drain regions 16 and 18 and channel region 20 are then formed by a conventional doping method. This includes the usual photo resist, etching and strip steps for removal of the field oxide followed preferably by a phosphorous diffusion step. Preferably, the doping of channel region 20 is in the range of $2\times10^{15}$ to $10^{17}$ atoms/$cm^3$, and most preferably in the range of $10^{16}$ to $10^{17}$ atoms/$cm^3$, which provides a resistance of about 1 ohm to 5 ohms. Preferably, the doping of the source/drain regions is in the range of $10^{19}$ to $10^{20}$ atoms/$cm^3$. Step 110 also includes formation, patterning and etching of semiconductor oxide layer 22 and, if present, optional interface insulator layer 24 using conventional techniques.

In step 112, a precursor for forming polycrystalline crystallographicallyoriented ferroelectric material in ferroelectric thin film 26 is prepared. The oriented ferroelectric material in accordance with the invention is typically a complex metal oxide and preferably a c-axis oriented layered superlattice material; for example, strontium bismuth tantalate having a stoichiometric formula $SrBi_2Ta_2O_9$. Preferably, ferroelectric thin film 26 is formed using an MOD method with a final precursor mixture containing the various components of the oriented ferroelectric compound. Individual initial precursors are formed by interacting each of the metals, for example, strontium, bismuth and tantalum, or an alkoxide of the metal, with a carboxylic acid, or with a carboxylic acid and an alcohol, and dissolving the reactant in a solvent. Carboxylic acids that may be used include 2-ethylhexanoic acid, octanoic acid, and neodecanoic acid, preferably 2-ethylhexanoic acid. Alcohols that may be used include 2-methoxyethanol, 1-butanol, 1-pentanol, 2-pentanol, 1-hexanol, 2-hexanol, 3-hexanol, 2-ethyl-1-butanol, 2-ethoxyethanol, and 2-methyl-1-pentanol, preferably 2-methoxyethanol. Solvents that may be used include xylenes, n-octane, 2-methoxyethanol, n-butyl acetate, n-dimethylformamide, 2-methoxyethyl acetate, methyl isobutyl ketone, methyl isoamyl ketone, isoamyl alcohol, cyclohexanone, 2-ethoxyethanol, 2-methoxyethyl ether, methyl butyl ketone, hexyl alcohol, 2-pentanol, ethyl butyrate, nitroethane, pyrimidine, 1, 3, 5 trioxane, isobutyl isobutyrate, isobutyl propionate, propyl propionate, ethyl lactate, n-butanol, n-pentanol, 3-pentanol, toluene, ethylbenzene, 1-butanol, 1-pentanol, 2-pentanol, 1-hexanol, 2-hexanol, 3-hexanol, 2-ethyl-1-butanol, 2-ethoxyethanol, and 2-methyl-1-pentanol, as well as many others. The metal, metal alkoxide, acid, and alcohol react to form a mixture of metal-alkoxocarboxylate, metal-carboxylate and/or metal-alkoxide, which mixture is heated and stirred as necessary to form metal-oxygen-metal bonds and boil off any low-boiling point organics that are produced by the reaction. Initial precursors are usually made or bought in batches prior to their use; the final precursor mixtures are usually prepared immediately before application to the substrate. Final preparation steps typically include mixing, solvent exchange, and dilution. In the examples discussed below, precursors for strontium bismuth tantalate contain metal moieties in relative proportions corresponding to the stoichiometric formula $A_aS_bB_cO_{[9+(a-1)+(b-2)(1.5)+(c-2)(2.5)]}$, where A represents strontium, S represents bismuth, B represents tantalum, $0.8<a\leq1$, $2\leq b<2.2$, and $1.8<c\leq2$.

In step 114, the final precursor for the ferroelectric thin film is applied to substrate 14. The precursor may be applied using any liquid source deposition method suitable for MOD solutions. Preferably, a misted deposition method is used. A CVD method may also be used. The misted deposition and CVD methods may start with a single final precursor, or a multisource method may be used such that individual precursors are mixed in the deposition apparatus just prior to deposition. In the example below, a two-coat liquid spin-on technique was used.

Forming the ferroelectric thin film includes treatment of the material deposited on the substrate. Treating may comprise one or more processes selected from the group including: exposing to vacuum, exposing to ultraviolet radiation, drying, heating, baking, rapid thermal processing, and annealing. Treating is typically conducted to influence crystallographic orientation in accordance with the invention. Nevertheless, a ferroelectric thin film in accordance with the invention may contain crystallographically oriented ferroelectric material formed by techniques different from the methods disclosed herein. In step 116, wafer 11 comprising substrate 14, on which the precursor has been deposited, is treated. In the preferred fabrication method, treatment typically includes drying, ultraviolet ("UV") radiation, rapid thermal processing ("RTP"), and annealing. Drying is typically performed for one minute at 160° C., then at 260° C. for four minutes.

In a preferred method, the UV is applied during deposition and during exposure to vacuum thereafter. The UV spectrum has wavelengths that range from about 4 to 400 nanometers ("nm"). A particularly preferred band of UV radiation for use in the invention has a wavelength ranging from about 180 nm to about 300 nm, and most preferably ranges from about 220 nm to about 260 nm. The UV radiation is preferably applied in step 114 through a Danielson UV light source, while the UV source in step 116 is preferably a tunable excimer laser; however, other acceptable UV sources exist, such as a deuterium ($D_2O$) lamp.

The UV exposure technique of step 114 preferably includes an exposure intensity ranging from five to twenty $mW/cm^2$ over a period of time ranging up to about ten minutes. Ultraviolet wavelengths in the most preferred range are intended to dissociate carbon to oxygen sigma bonds in the precursor solution. The dissociated organic ligands and other substituents can then be removed from the substrate as vapor. This UV-induced dissociation provides a metal oxide having a reduced carbon content, as compared to "standard" metal oxides that formed in the absence of concentrated UV radiation.

The UV radiation also influences the formation of crystal grains in metal oxide materials produced according to this process, as confirmed through c-axis orientation differences in X-ray diffraction peak intensity values. This UV-influenced crystal formation is also characterized by significant changes in the electronic properties of the metal oxides, namely, polarization fatigue and leakage current improvements.

In some of the examples described below in which UV radiation was used to enhance c-axis orientation, the substrate was exposed to UV radiation during the heating treatment. The RTP is typically done at 725° C. for 30 seconds, with a 100° C./sec ramping rate. A furnace anneal, preferably in an oxygen atmosphere at 800° C. for60 minutes, crystallizes the crystallographically oriented ferroelectric layered superlattice material.

In step 118, a gate electrode 30 is formed using conventional methods. Preferably, the gate electrode comprises platinum that is sputter-deposited to make a layer with a 200 nm thickness; but it may be other metals or conductors also. Finally, in step 120, the integrated circuit ferroelectric FET device is completed, which includes forming interlayer dielectric layers, local interconnects, passivation layers and packaging.

The following non-limiting examples demonstrate preferred materials and electronic characteristics of oriented ferroelectric layered superlattice materials used in preferred embodiments of ferroelectric FETs in accordance with the invention.

EXAMPLE 1

Production of C-Axis Oriented Layered Superlattice Material with UV Processing

Figure 6:
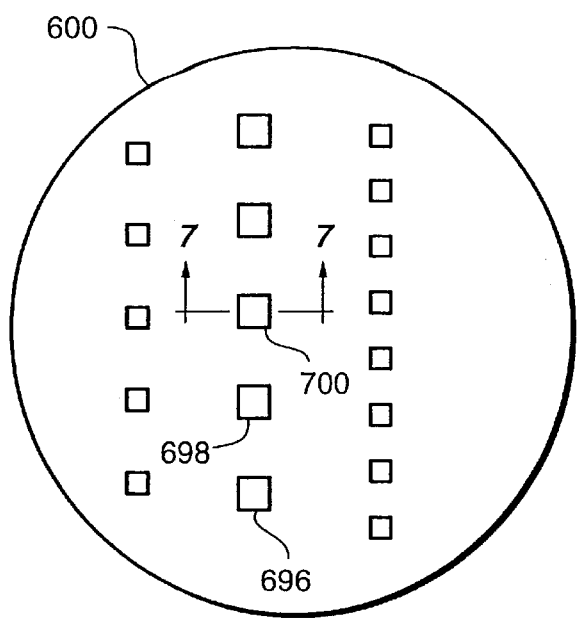
FIG. 6 depicts an exemplary wafer on which capacitors 696, 698, and 700 have been formed.
Figure 7:
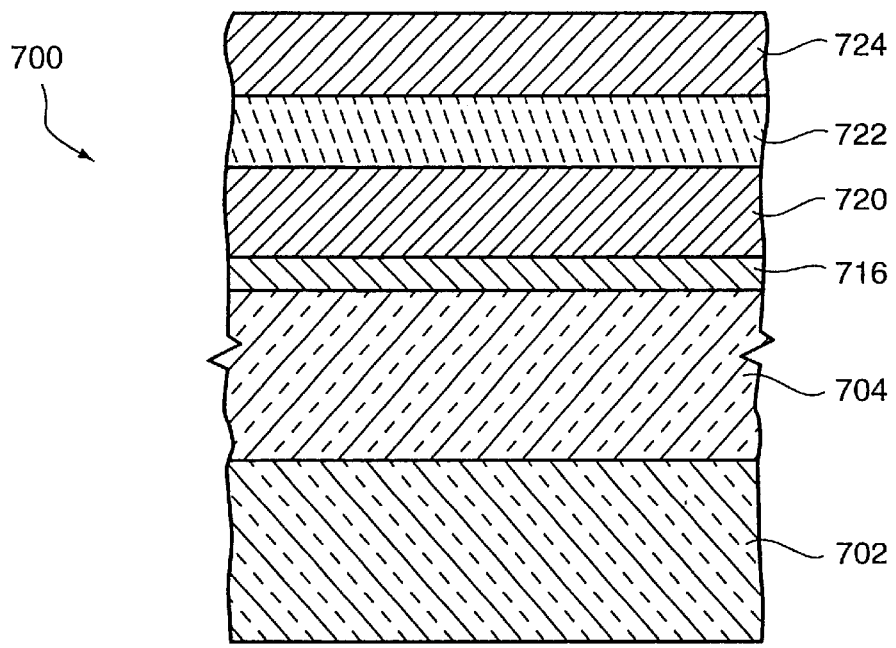
FIG. 7 depicts a cross-sectional view of capacitor 700 taken through line 7—7 of FIG. 6.

Conventional four-inch diameter standard p100 silicon semiconductor wafers 600, as depicted in FIG. 6, were prepared to receive a final precursor solution for forming strontium bismuth tantalate ("SBT"). The single precursor solution contained mole fractions of atoms corresponding to the unbalanced stoichiometric formula $SrBi_{2.18}Ta_{2.0}O_{9.27}$ in the absence of bismuth volatilization. Each of the wafers was baked in a diffusion furnace in oxygen at 1100° C. according to conventional protocols to yield a thick coating of silicon oxide 704 on silicon substrate 702 (see FIG. 7). The wafers including field oxide 704 were cooled to room temperature, and inserted into a vacuum chamber for conventional DC magnetron sputtering. A discharge voltage of 95 volts and a current of 0.53 amperes was utilized at a sputter pressure of 0.0081 Torr to sputter a 16 nm thick layer 716 of titanium metal on oxide layer 704. A discharge voltage of 130 volts and a current of 0.53 amperes was then used to sputter a 220 nm thick bottom electrode layer 720 of platinum atop the titanium layer 716.

Each wafer (including titanium layer 716 and platinum bottom electrode layer 720) was annealed in a diffusion furnace under a nitrogen atmosphere at 450° C. for two hours and ten minutes. This time included a five minute push into the furnace and a five minute pull out of the furnace.

A 2 ml volume of the 0.2M final precursor was adjusted to a 0.13M concentration by the addition of 1.08 ml n-butyl acetate, and passed through a 0.2 $\mu$m filter. Each wafer was spun at 1500 rpm in a conventional spin-coater machine. An eyedropper was used to apply precursor solution to the substrate for thirty seconds while spinning.

After removal from the spin-coating machine, the precursor-coated substrates of all of the wafers were treated by drying and RTP. Selected wafers were also given UV radiation treatment. The substrate of each wafer was dried in air for two minutes on a 140° C. hot plate. The substrate was dried for an additional four minutes on a second hot plate at 260° C. An RTP treatment of each wafer was conducted for an additional thirty seconds in oxygen at 725° C. using a HEATPULSE 410 tungsten-halogen lamp apparatus that was purchased from AG Associates Inc. as the heat source. The tungsten-halogen lamp included eight J208V bulbs (purchased from Ushio of Japan) for a total of 1200 W. The lamp heating profile included a 100° C./second ramp up to 725° C. from room temperature. The spin-coating and treating procedure was repeated a second time to increase the overall thickness of layer 722. In a first annealing step, after treatment of the substrate by drying and RTP, the dried precursor material in the position of layer 722 was annealed in an oxygen ($O_2$) atmosphere for eighty minutes at 800° C. in a diffusion furnace. This time included a five minute push into the furnace and a five minute pull out of the furnace.

For selected wafers, treatment of each spin-coat layerfurther included exposing the substrate to UV radiation. The UV source that was utilized was a Danielson lamp that yielded a spectrum ranging from 180 nm to about 300 nm with an intensity of about 9 $mW/cm^2$ at 220 nm and 15 $mW/cm^2$ at 260 nm. The substrates were not exposed to UV radiation while being exposed: to light from the tungsten-halogen lamp during RTP. The drying and UV exposure conditions for the various wafers were varied as described below in Table 1. These procedures produced different capacitor samples that were designated MS1-N, MS1-L, MS2-N, MS2-L, MS3-N, MS3-L, MS4-N, and MS4-L. As indicated in Table 1, the MS1-N and MS1-L samples were each subject to UV lighting for five minutes while drying at 150° C. and 270° C. The MS1-L sample received additional UV treatment for five minutes before the first annealing step. The MS2-N and MS2-L were subjected to UV lighting during drying for five minutes at a temperature of 270° C.

The MS2-L sample was also subjected to UV lighting before the first annealing step in oxygen. The MS3-N and MS3-L samples received no UV radiation treatment during drying, but the MS3-L sample received UV radiation treatment for five minutes before annealing. The MS4-N and MS4-L wafers received no UV radiation treatment during drying at 150° C.; however, the final precursor for these wafers was exposed to UV radiation for five minutes at 150° C. before spin-on. The MS4-L sample also received UV radiation treatment for five minutes during drying at 270° C.

TABLE 1

TREATMENT VARIATIONS

| | UV Lighting | | |
|---|---|---|---|
| | During Drying | | Before |
| Sample # | 150° 5 minutes | 270° 5 minutes | Annealing 5 minutes |
| MS1-N | Y | Y | — |
| MS1-L | Y | Y | Y |
| MS1-N | — | Y | — |
| MS2-L | — | Y | Y |
| MS3-N | — | — | — |
| MS3-L | — | — | Y |
| MS4-N* | — | — | — |
| MS4-L* | — | Y | — |

*UV lighting was applied to the precursor (5 min., 150° C.) before spin-on.

After treatment of layer 722, a top electrode layer 724 of platinum metal was sputtered to 220 nm thickness using a DC magnetron as before. The substrate was patterned using a conventional negative resist mask and argon ion etching. After removal of the resist, the device was annealed under oxygen at 800° C. for forty minutes including a five minute push into the diffusion furnace and a five minute pull out of the furnace.

The final capacitor samples had top electrode surface areas of 6940 $\mu m^2$. Measurements were conducted in sample capacitors to determine thickness, dielectric constant of the thin-layer, 2Pr polarization at about 3 volts, and 2Ec at about 3 volts. These results are presented in Table 2 below.

TABLE 2

| Sample # | Thickness (nm) | Dielectric Constant* | 2Pr @ 3 V (uC/cm2) | 2Ec @ 3 V (kV/cm) |
|---|---|---|---|---|
| MS1-N | 175 | 193 | 8.5 | 132 |
| MS1-L | 175 | 192 | 8.4 | 132 |
| MS2-N | 180 | 360 | 19.3 | 95.4 |
| MS2-L | 180 | 364 | — | — |
| MS3-N | 189 | 381 | 18.0 | 88.3 |
| MS3-L | 189 | 379 | 18.3 | 87.6 |
| MS4-N* | 187 | 367 | 17.0 | 90.8 |
| MS4-L* | 187 | 375 | — | — |

*UV lighting was applied to the precursor (5 min., 150° C.) before spin-on.

The MS1-N and MS1-L samples had a dielectric constant of about one-half the magnitude of the respective MS2, MS3, and MS4 samples. These samples also had significantly lower leakage current and about a 40% larger 2Ec than did the other samples. Accordingly, it is seen that UV treatment has a greater effect in the early drying stages of metal oxide formation than in other stages.

EXAMPLE 2

X-Ray Diffraction Measurements

Figure 8:
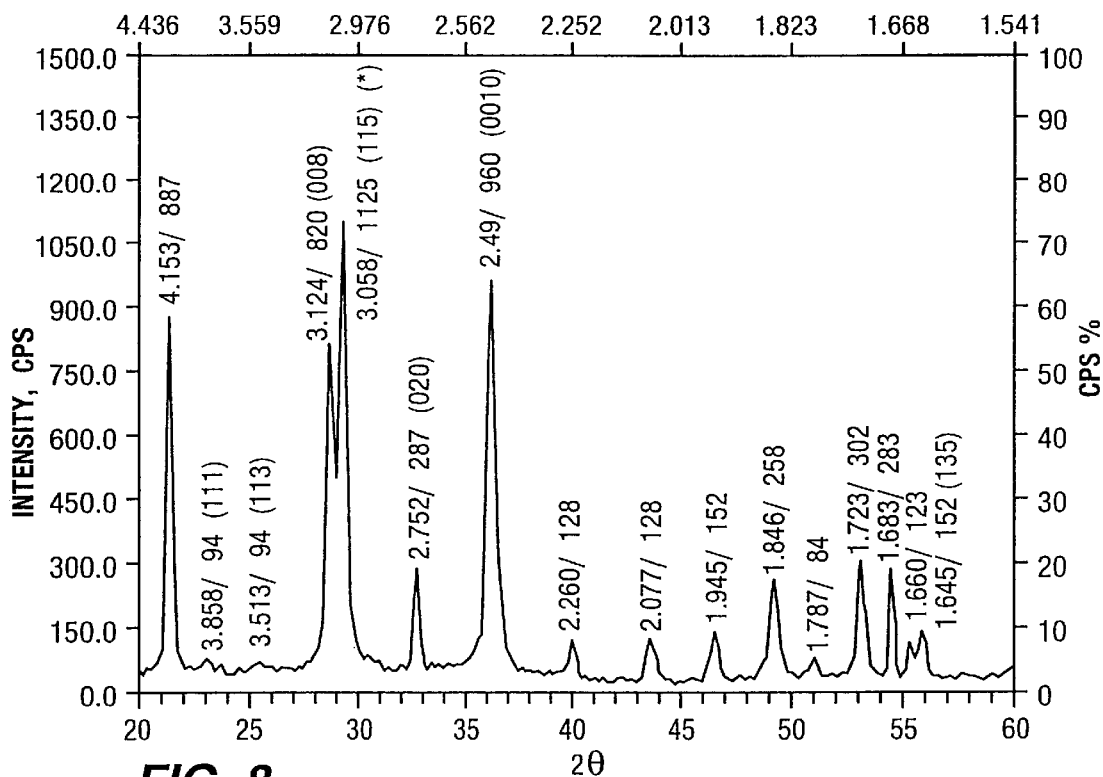
FIG. 8 contains the results of an X-ray diffraction analysis of a strontium bismuth tantalate material in which intensity in counts per second is plotted as a function of twice the Bragg angle.
Figure 9:
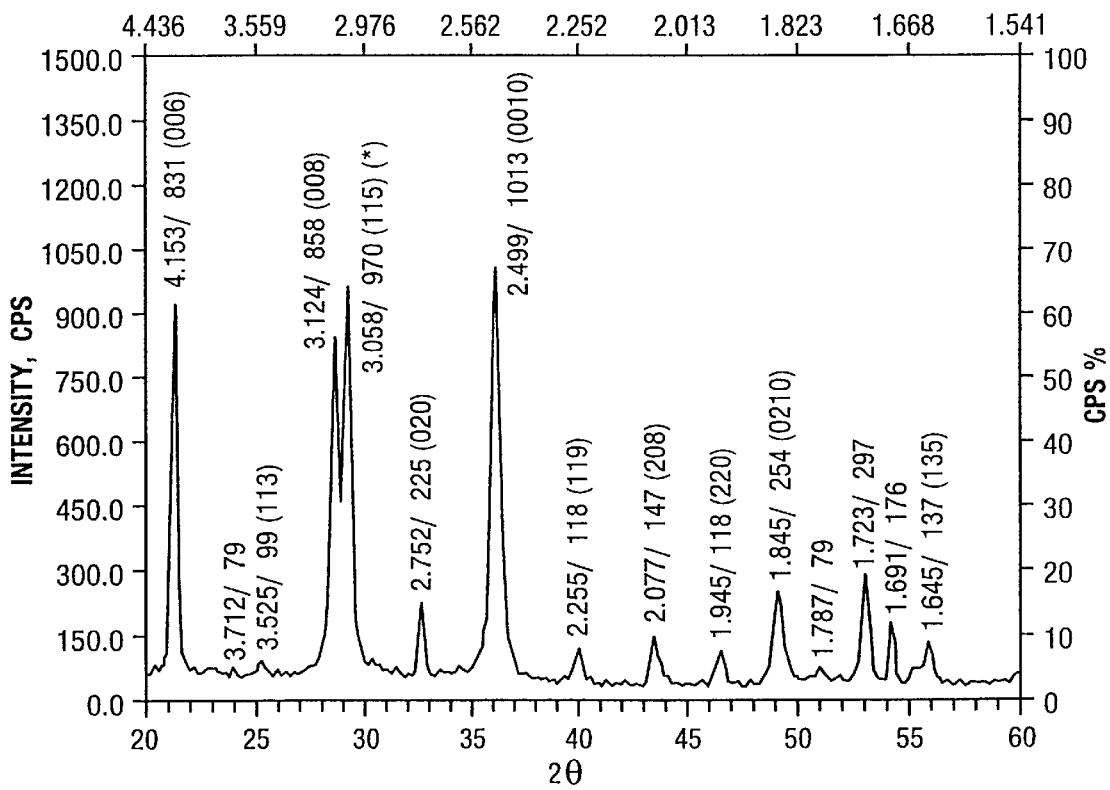
FIG. 9 depicts X-ray diffraction data as in FIG. 8, but includes data from a strontium bismuth tantalate material of identical stoichiometry that was subjected to different UV lighting conditions in processing.

The respective $SrBi_{2.18}Ta_{2.0}O_{9.27}$ "MS" samples of Example 1 were subjected to conventional X-ray diffraction analysis, with FIGS. 8 through 12 depicting the results. Each of FIGS. 8–12 contains a graph of X-ray intensity, as determined by a photodiode count of impinging radiation in counts per second ("CPS"), plotted as a function of the Bragg angle. The abscissa represents a circumferential distance of the Bragg X-ray spectrometer, which has been converted to a value of two times the Bragg angle ("2Θ"). Each peak has been labeled with a distance corresponding to the 2Θ value, intensity count in counts per second, and lattice point determination (in parentheses), which have been determined according to conventional techniques as will be understood by those skilled in the art. FIGS. 8 and 9 contain the results for the MS1-N and MS1-L samples, respectively, and are substantially identical with one another. This similarity indicates that the act of applying ultraviolet radiation prior to annealing the sample fails to produce substantial crystalline reorientation in superlattice materials when the UV application before anneal is conducted subsequent to having applied ultraviolet radiation during the drying step.

Figure 10:
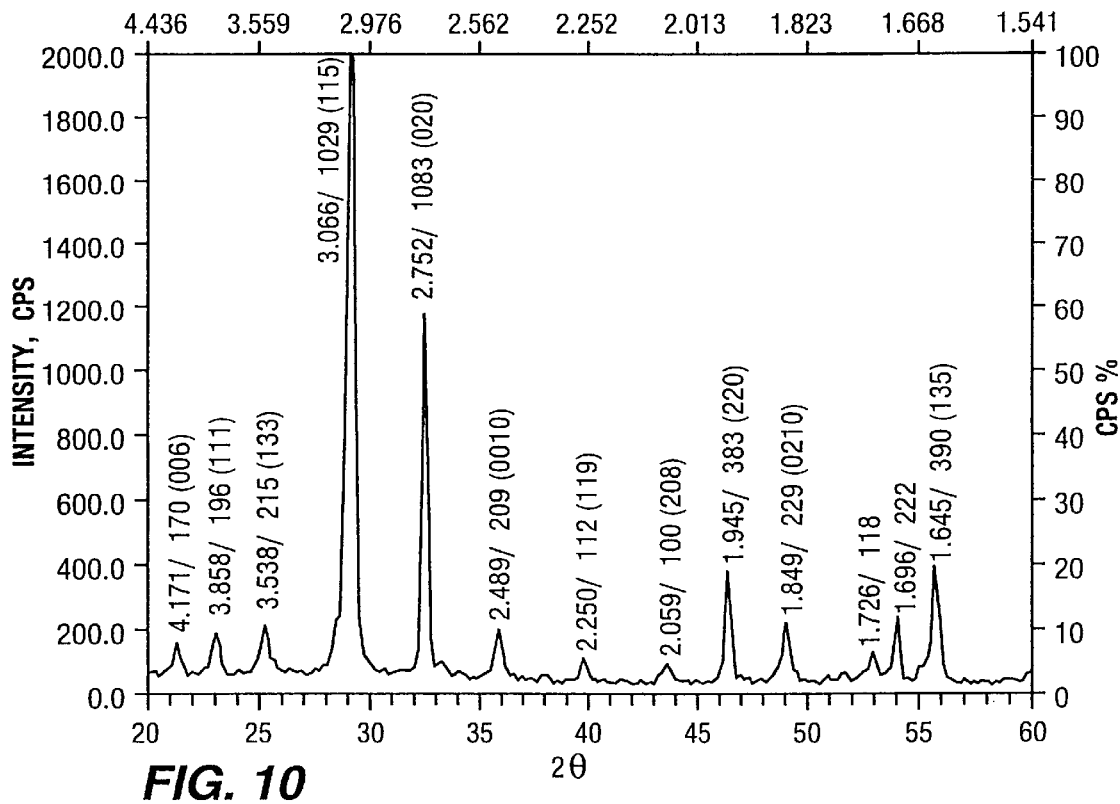
FIG. 10 depicts X-ray diffraction data as in FIGS. 8 and 9, but includes data from a strontium bismuth tantalate material of identical stoichiometry that was subjected to further different UV lighting conditions in processing.
Figure 11:
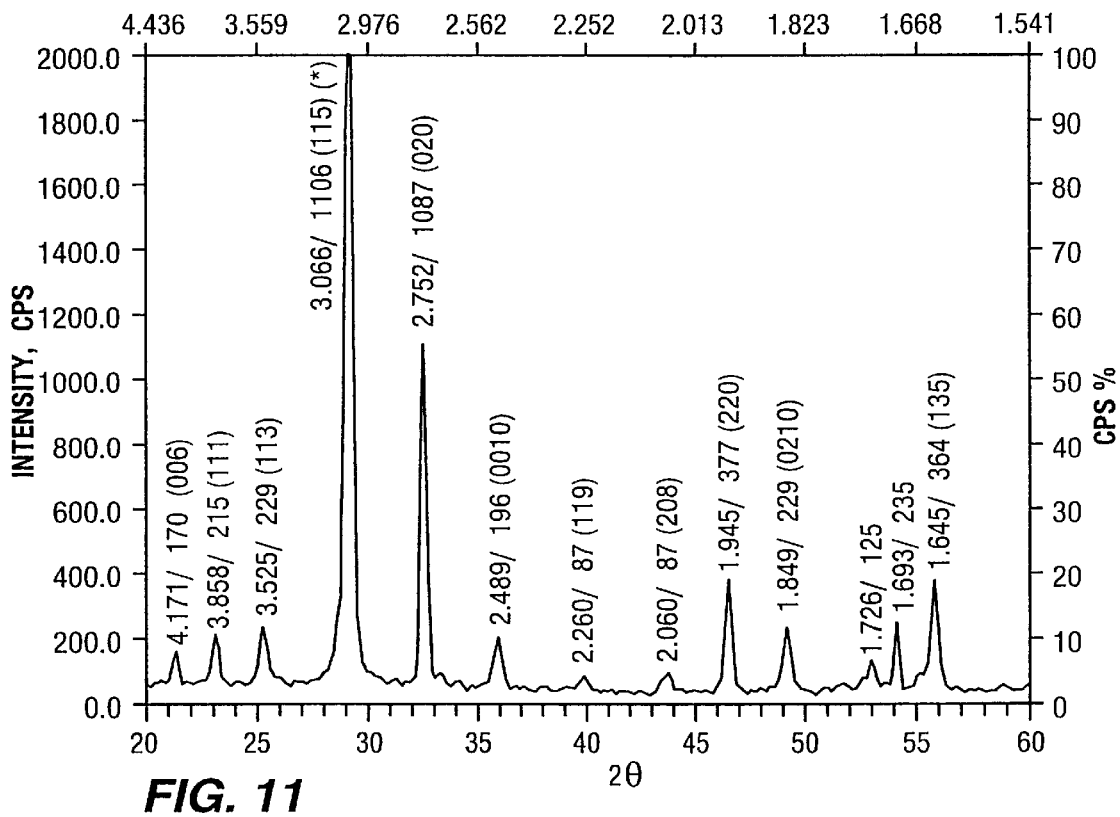
FIG. 11 depicts X-ray diffraction data as in FIGS. 8, 9, and 10, but includes data from a strontium bismuth tantalate material of identical stoichiometry that was subjected to yet another set of UV lighting conditions in processing.
Figure 12:
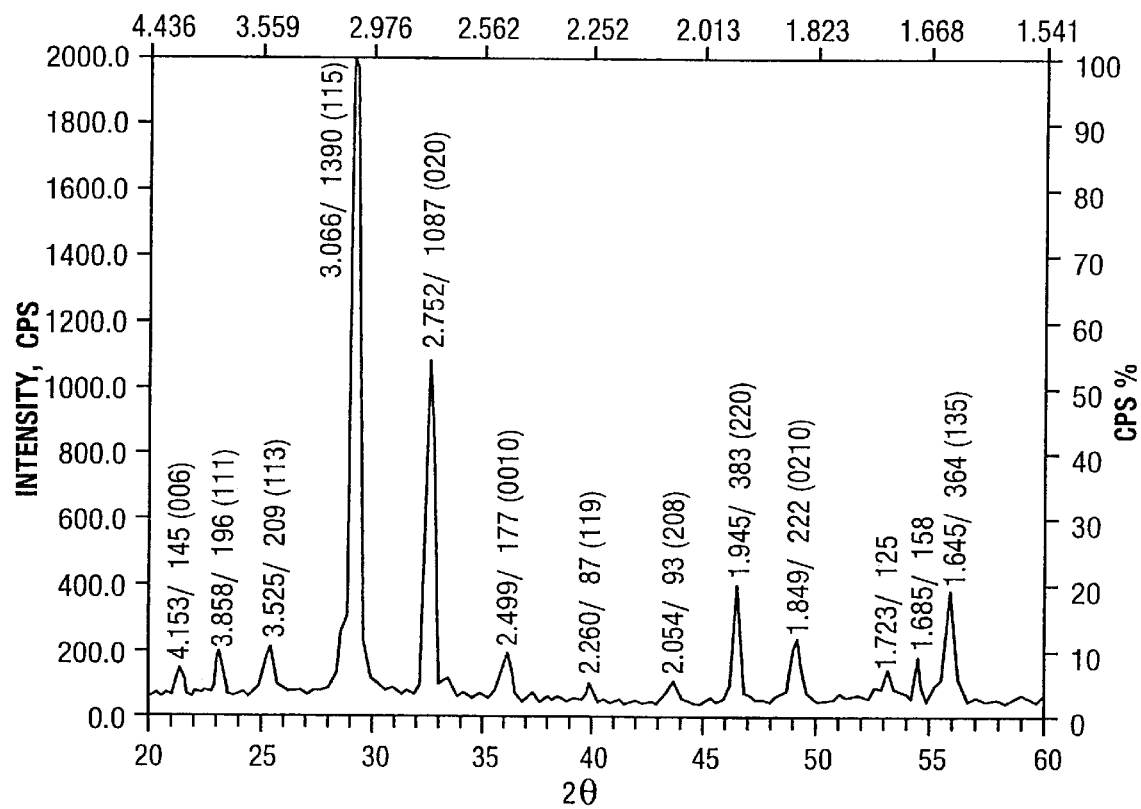
FIG. 12 depicts X-ray diffraction data as in FIGS. 8, 9, 10, and 11, but includes data from a strontium bismuth tantalate material of identical stoichiometry that was subjected to yet another set of UV lighting conditions in processing.

FIGS. 10 (MS2-N), 11 (MS3-N) and 12 (MS4-N) depict substantial differences as compared with the MS1 samples. More specifically, the MS2-N, MS3-N and MS4-N samples, while very similar to each other, have marked differences in terms of peak intensity values, as compared with the MS1-N sample. By way of example, the (006), (008), and (00$\underline{10}$) lattice point peaks have a greater intensity in MS1-N (FIG. 8) than in MS3-N (FIG. 11); e.g., peak (006) has an intensity value of 887 in MS1-N and a peak intensity value of 170 in MS3-N. FIG. 8 also shows peak (020) having an intensity of 207, while FIG. 11 shows peak (020) having an intensity of 1087. The quantity 887/207 (FIG. 8) versus the quantity 170/1087 (FIG. 11) shows a greater relative abundance of lattice point (006) with respect to lattice point (020) in FIG. 8. Accordingly, UV radiation has induced lattice changes in these materials having identical stoichiometries. Similar relative abundance differences are apparent across peaks (008) and (00$\underline{10}$). These values indicate that the MS1 samples have a greater c-axis grain orientation in the coordinate system (abc).

Analysis of the results presented in FIGS. 8–12 indicates that the MS1-N and MS1-L samples have significant crystalline reorientations that are directed along the c-axis. Thus, UV radiation treatment, especially during the drying procedure, enhances c-axis orientation. This observation of a UV-induced orientation favoring the c-axis is confirmed by the fact that peak intensities for Miller Index values (111), (113), (020), and (135) are less abundant in sample MS1-N than in MS3-N, which received no UV radiation.

In the following examples, if a wafer or capacitor is described as "UV-treated c-axis oriented", then it was fabricated with the method used for wafer MS1-N of Example 1. The term "standard process" indicates that no UV treatment was used, and that the sample of ferroelectric material is not crystallographically oriented in accordance with the invention.

EXAMPLE 3

Comparative Leakage Current Measurements

Figure 13:
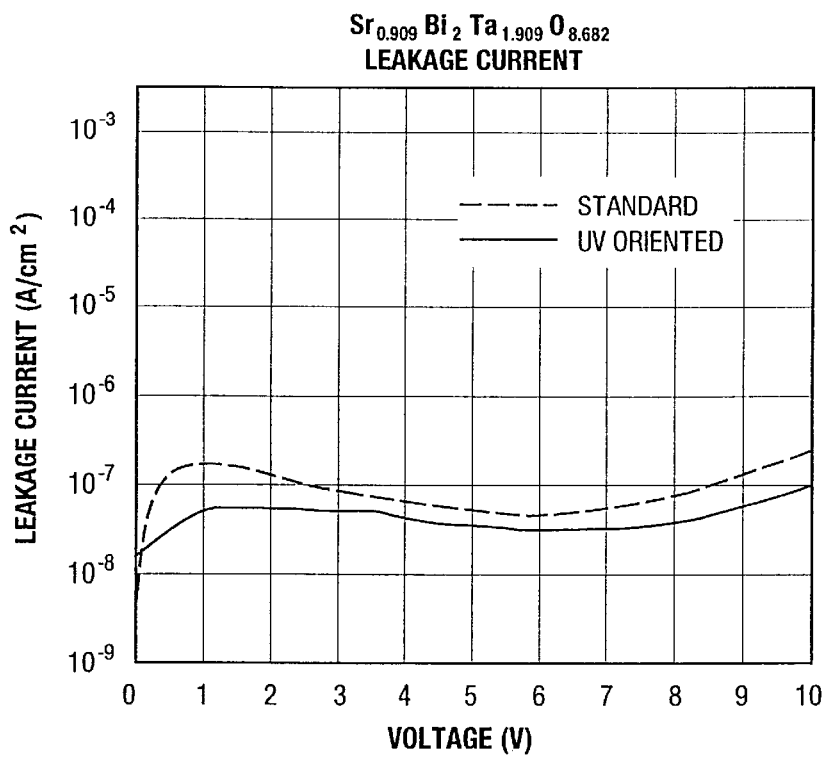
FIG. 13 depicts a graph of leakage current density versus voltage comparing a standard process strontium bismuth tantalate capacitor, in which the thin film was baked on a hot plate without UV radiation, with a UV-treated c-axis oriented strontium bismuth tantalate capacitor.

A capacitor that contained a standard process $Sr_{0.909}Bi_2Ta_{1.909}O_{8.682}$ sample produced according to the method of Example 1 without UV treatment was operably connected to a Hewlett-Packard 4145A semiconductor analyzer (picoampmeter) for purposes of conducting leakage current measurements. A second capacitor that included a UV-treated c-axis oriented $Sr_{0.909}Bi_2Ta_{1.909}O_{8.682}$ sample produced according to the method for wafer MS1-N of Example 1 was subjected to identical measurements. FIG. 13 is a graph of the data obtained, in which leakage current in amperes per $cm^2$ (logarithmic scale) is plotted as a function of voltage on the abscissa. The data points were obtained in 0.05 V increments in a range between 0 V and 10 V. The magnitude of the leakage current density for both samples varied between $10^{-7}$ and $10^{-8}$ over the interval between 1 V and 8 V. The relatively straight interval lines indicate that a single charge transfer mechanism predominated over the 2 V–8 V interval. The standard sample (indicated by the dashed line) consistently remained about one-half of an order of magnitude greater than that of the UV-treated c-axis oriented sample. Accordingly, it is seen that UV treatment in the drying process, which enhances c-axis orientation, provides a lower (and better) leakage current density in strontium bismuth tantalate materials.

Figure 14:
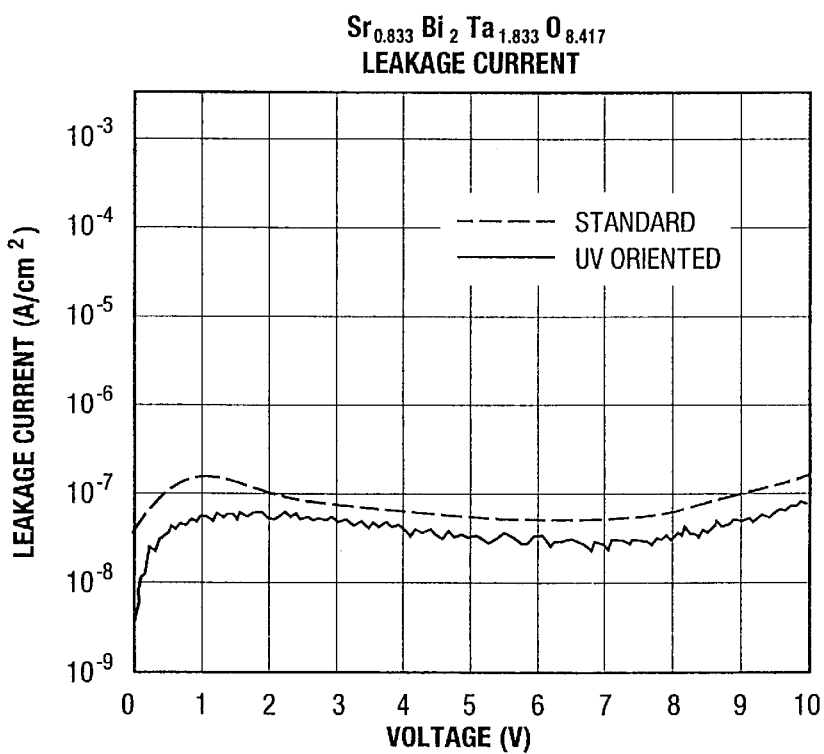
FIG. 14 is a graph like that of FIG. 13, but includes comparative leakage current density data for strontium bismuth tantalate samples having a different stoichiometric composition from the subject material of FIG. 13.

A standard process $Sr_{0.833}Bi_2Ta_{1.833}O_{8.417}$ sample that was prepared according to Example 1 without UV was subjected to leakage current measurements, as was a UV-treated c-axis oriented $Sr_{0.833}Bi_2Ta_{1.833}O_{8.417}$ sample made using the method for wafer MS1-N of Example 1. FIG. 14 depicts the results as a graph of leakage current density in log (amps/$cm^2$) versus applied voltage. Again, the UV-treated c-axis oriented sample had a lower leakage current, which ranged from about 0.5 to 0.25 of an order of magnitude less than the standard sample over the voltage interval between one and ten volts.

Figure 15:
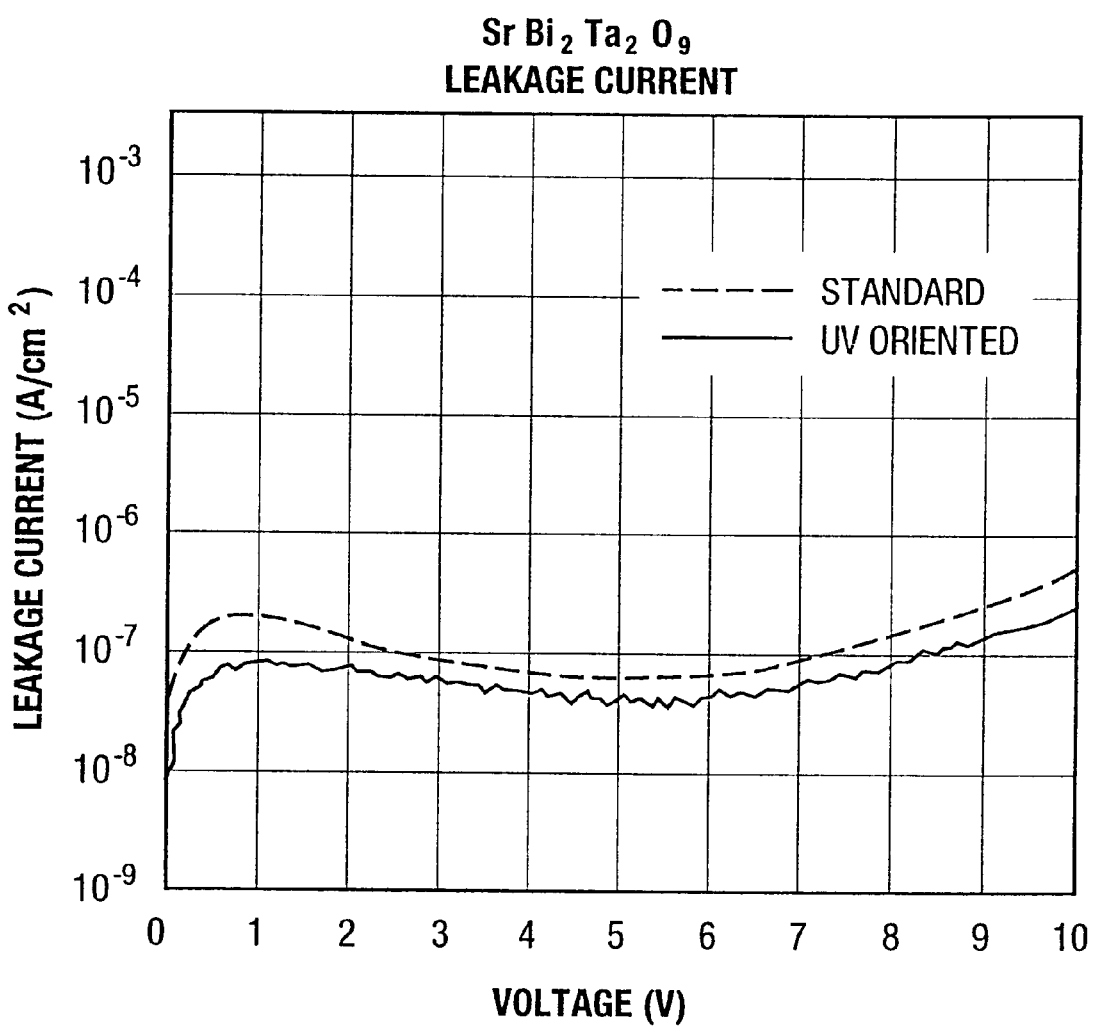
FIG. 15 is a graph like that of FIGS. 13 and 14, but includes comparative data obtained from strontium bismuth tantalate samples of yet another stoichiometry.

A standard process $SrBi_2Ta_2O_9$ sample prepared according to Example 1 was subjected to leakage current measurements in comparison against those from a UV-treated c-axis oriented sample. FIG. 15 depicts the results. Again, the UV-treated c-axis oriented sample had a leakage current density of about 0.2 to 0.5 of an order of magnitude less than the standard process sample.

EXAMPLE 4

Comparative Polarization Measurements

Figure 16:
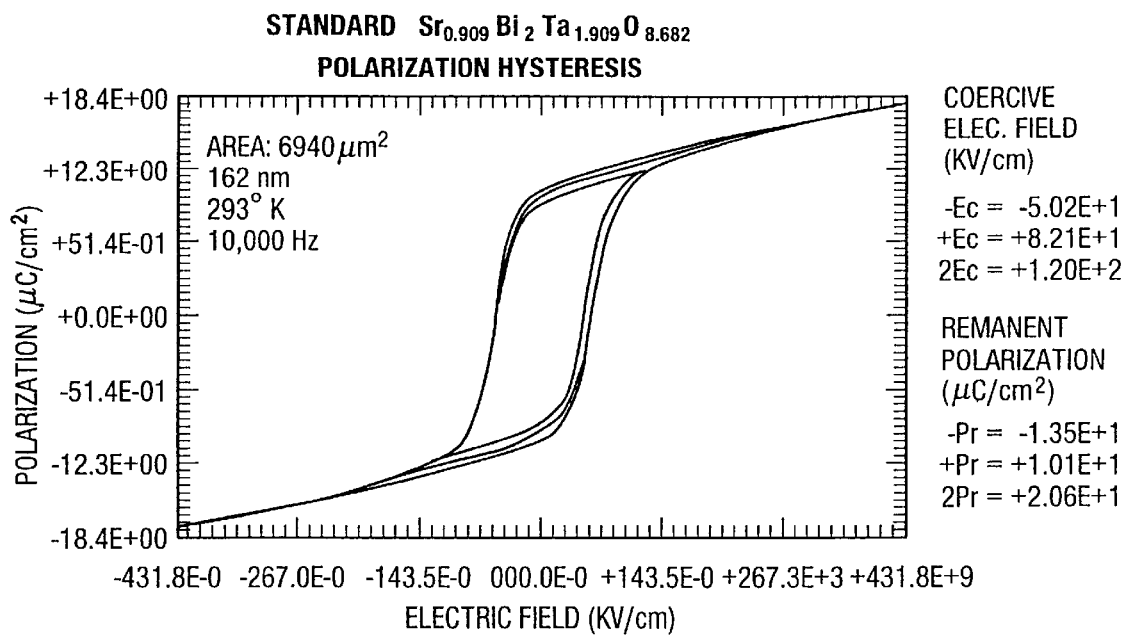
FIG. 16 depicts polarization hysteresis curves for a standard process strontium bismuth tantalate material, plotted as polarization versus applied electric field.

A capacitor that included a 160 nm thickness of standard process $Sr_{0.909}Bi_2Ta_{1.909}O_{8.682}$ material was subjected to polarization hysteresis measurements on an uncompensated Sawyer-Tower circuit including a Hewlett-Packard 3314A function generator and a Hewlett-Packard 54502A digitizing oscilloscope. Measurements were obtained from the film at 20° C. using a sine wave function having a frequency of 10,000 Hz and voltage amplitudes of 0.25 V, 0.5 V, 1.0 V, 1.5 V, 2.0 V, 2.5 V, 3.0 V, 4.0 V, 5.0 V, and 7.0 V. FIG. 16 is a graph of the data obtained as a polarization hysteresis curve for each of the voltage amplitudes. The abscissa is an electric field, in units of kV/cm, and the ordinate is measured polarization, in $\mu C/cm^2$. The steeply rising, quasi-rectangular, boxy nature of the hysteresis curve indicates an excellent ferroelectric memory-switching performance with a remanent polarization (2Pr) value of about 21 $\mu C/cm^2$ at voltages greater than about 5 V.

Figure 17:
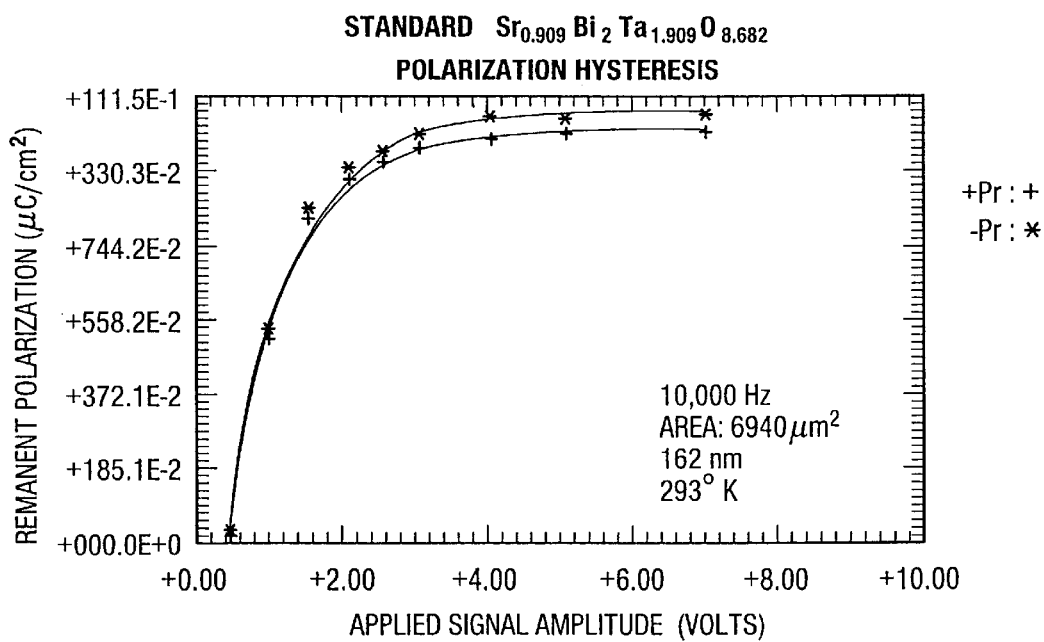
FIG. 17 is a graph of remanent polarization values versus applied voltage for the standard process strontium bismuth tantalate material of FIG. 16.
Figure 18:
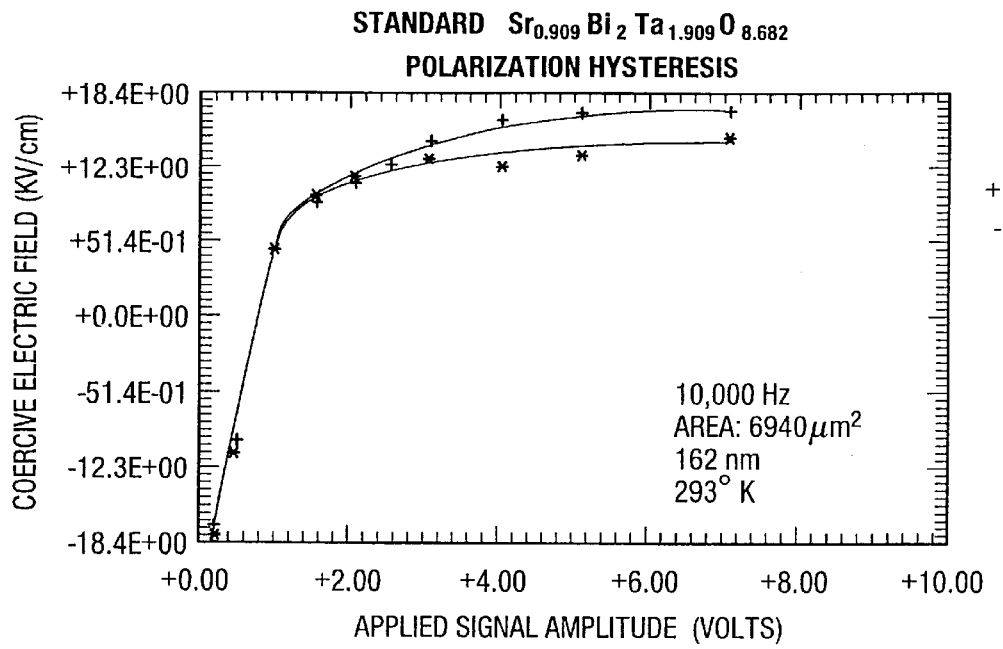
FIG. 18 is a graph of coercive electric field versus allied voltage for the standard process strontium bismuth tantalate material of FIG. 16.

FIG. 17 is a graph of remanent polarization, 2Pr, versus applied voltage in standard-process capacitors for each of the hysteresis loops in FIG. 16, and indicates that the standard process $Sr_{0.909}Bi_2Ta_{1.909}O_{8.682}$ sample was fully switched at applied voltages greater than about 2 V. FIG. 18 is a plot of coercive electric field versus applied voltage for each of the polarization loops of FIG. 16, and indicates that a coercive electric field of about 54.4 kV/cm was required to switch the standard process sample.

Figure 19:
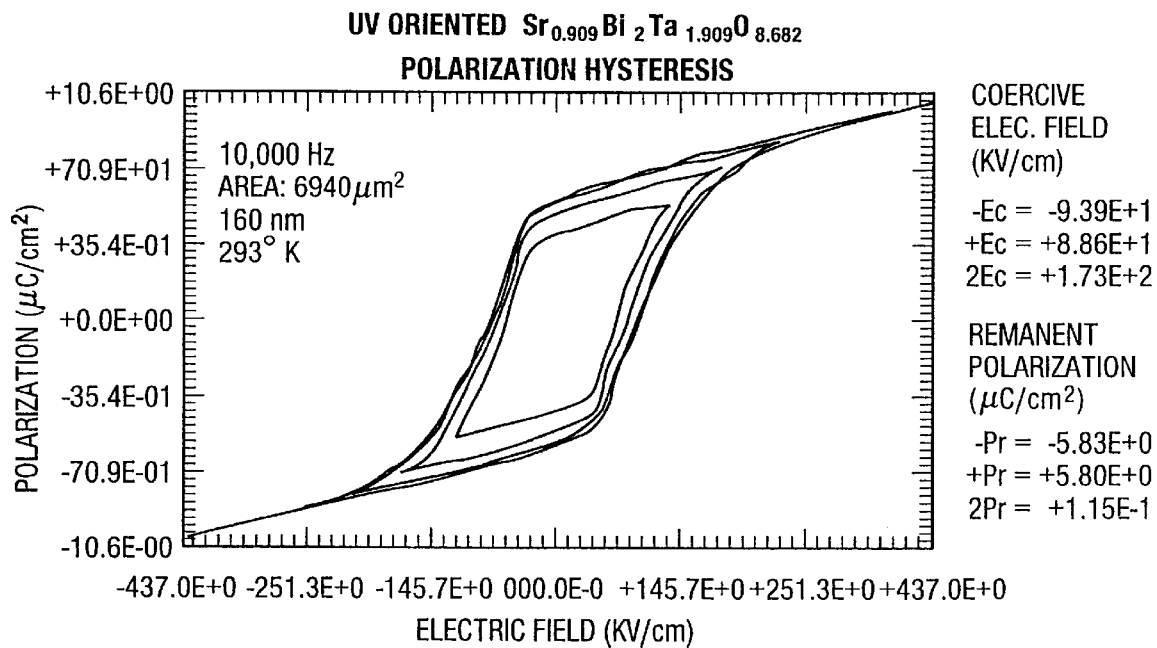
FIG. 19 is a graph containing a polarization hysteresis curve like that of FIG. 16, but includes data obtained from a UV-treated c-axis oriented strontium bismuth tantalate material having the same stoichiometry as that of the FIG. 16 sample.
Figure 20:
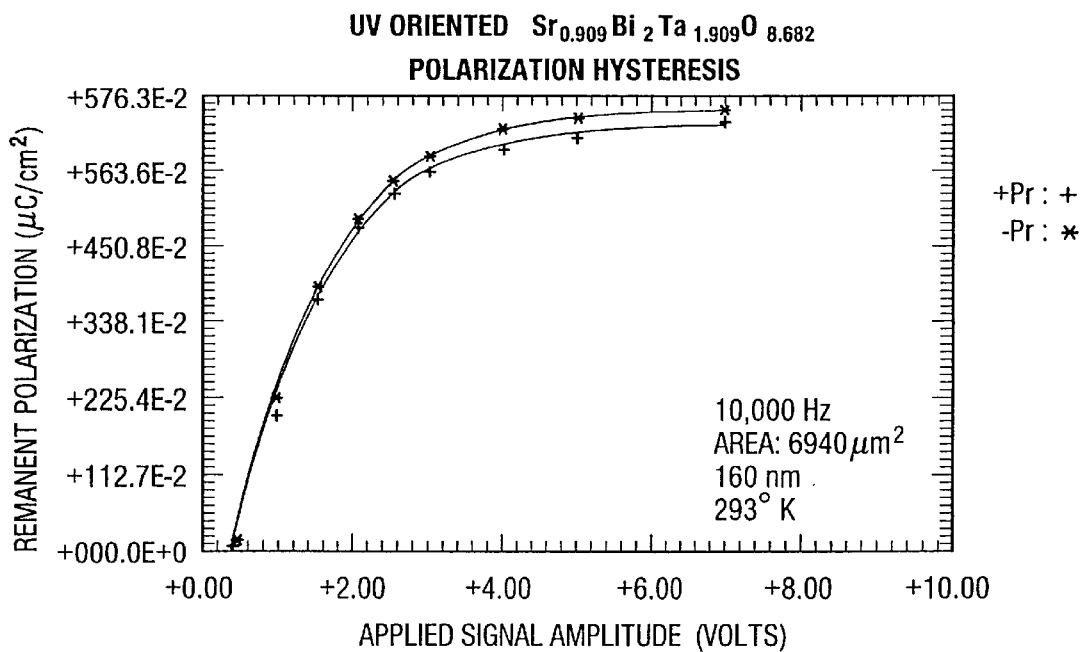
FIG. 20 is a graph of remanent polarization values versus applied voltage for the UV-treated c-axis oriented strontium bismuth tantalate material of FIG. 19.
Figure 21:
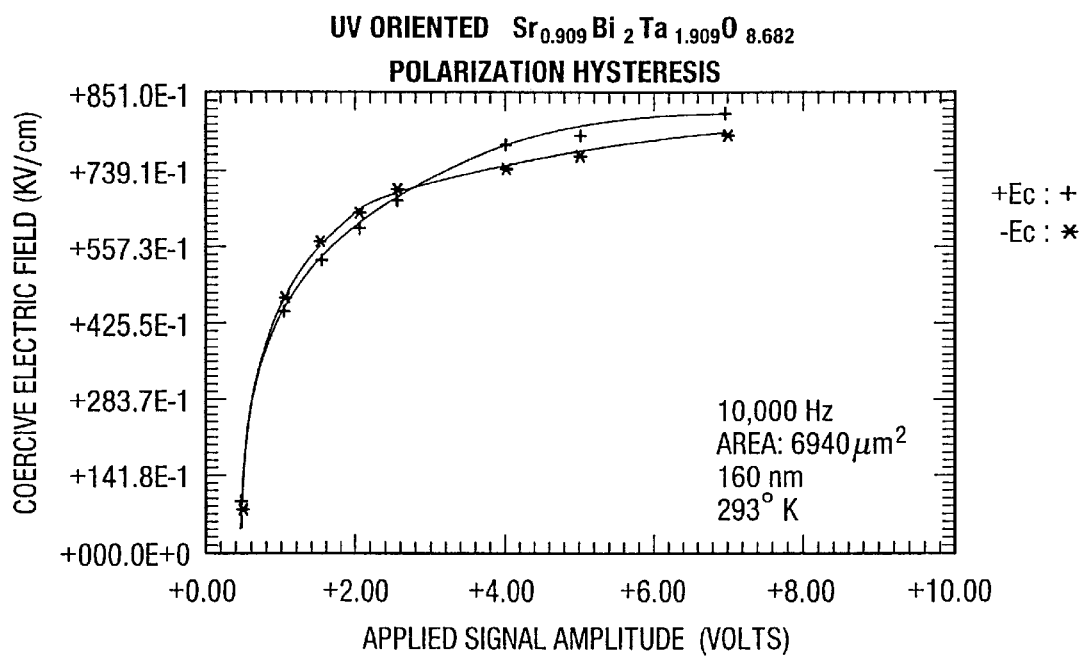
FIG. 21 is a graph of coercive electric field versus allied voltage for the UV-treated c-axis oriented strontium bismuth tantalate material of FIG. 19.

A UV-treated c-axis oriented $Sr_{0.909}Bi_2Ta_{1.9093}O_{8.682}$ sample was subjected to identical hysteresis measurements for comparative purposes. FIG. 19 is a polarization hysteresis plot like that of FIG. 16, and indicates that 2Pr polarization dropped to 11.5 $\mu C/cm^2$ at voltages exceeding about 5 V for the UV-treated c-axis oriented sample. FIG. 20 is a plot of remanent polarization versus applied voltage for each of the hysteresis loops in FIG. 19, and indicates that the UV-treated c-axis oriented $Sr_{0.909}Bi_2Ta_{1.909}O_{8.682}$ sample was fully switched at applied voltages greater than about 2 V. FIG. 21 is a plot of coercive electric field versus applied voltage for each of the polarization loops of FIG. 9, and indicates that a coercive electric field of about 70 kV/cm was required to switch the standard process sample.

Figure 22:
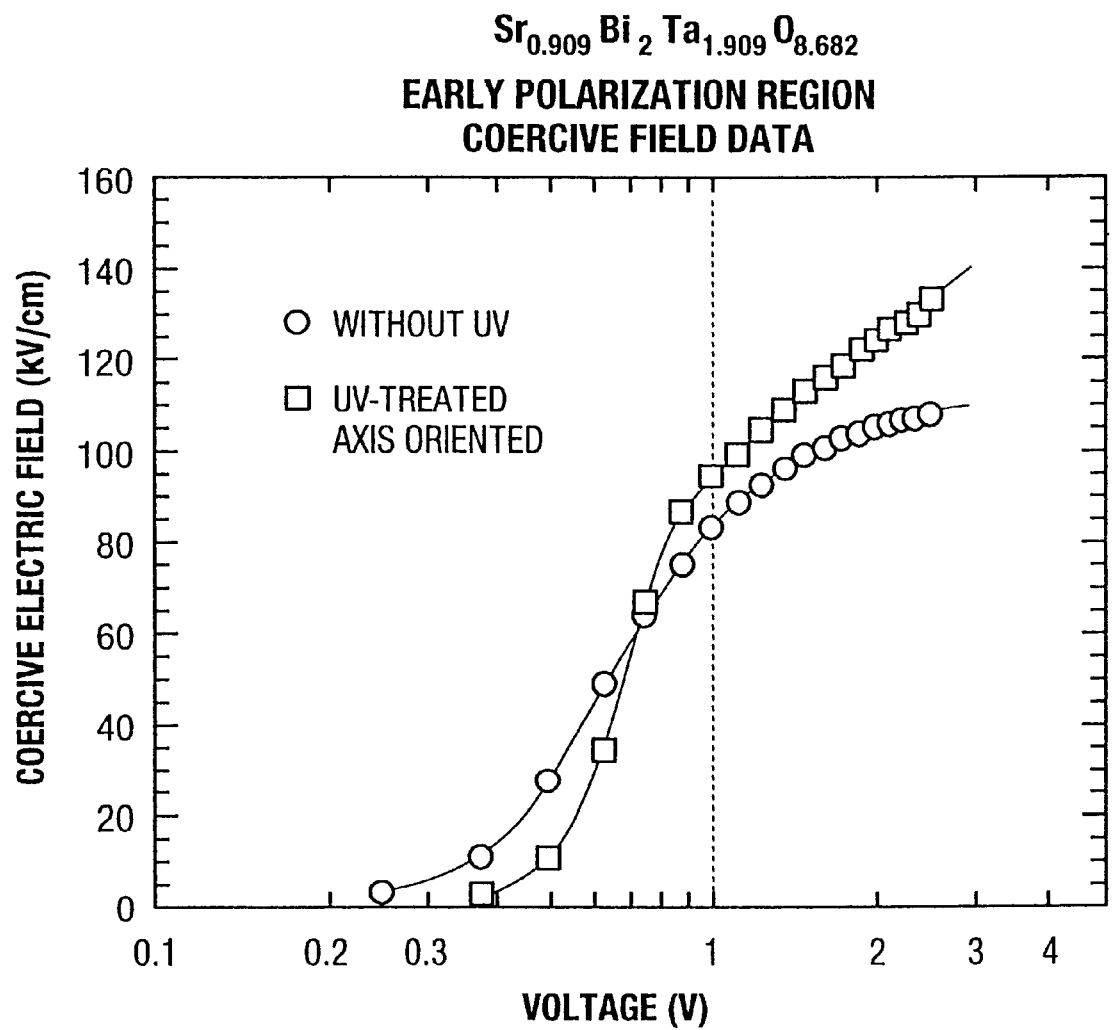
FIG. 22 is a graph containing a coercive electric field curve for the early region of two strontium bismuth tantalate samples that had identical stoichiometries, but were processed under different UV lighting conditions.

Polarization measurements on the standard process and UV-treated c-axis oriented samples of the $Sr_{0.909}Bi_2Ta_{1.909}O_{8.682}$ materials were repeated using a smaller voltage increment step of 0.13 V. FIG. 22 depicts the results for both samples, and serves to compare the early region of the polarization curves. The UV-treated c-axis oriented sample has a steeper rise in the early applied voltage range from 0.3 V to 1.0 V. The steeper rise in this region of the curve is a performance improvement relative to the standard process sample because the more gradual rise of the standard process material makes this material more susceptible to noise-induced partial polarization switching. The UV-treated c-axis oriented sample is more resistant to the effects of electric noise.

EXAMPLE 5

Comparative Fatigue Endurance Measurements

Figure 23:
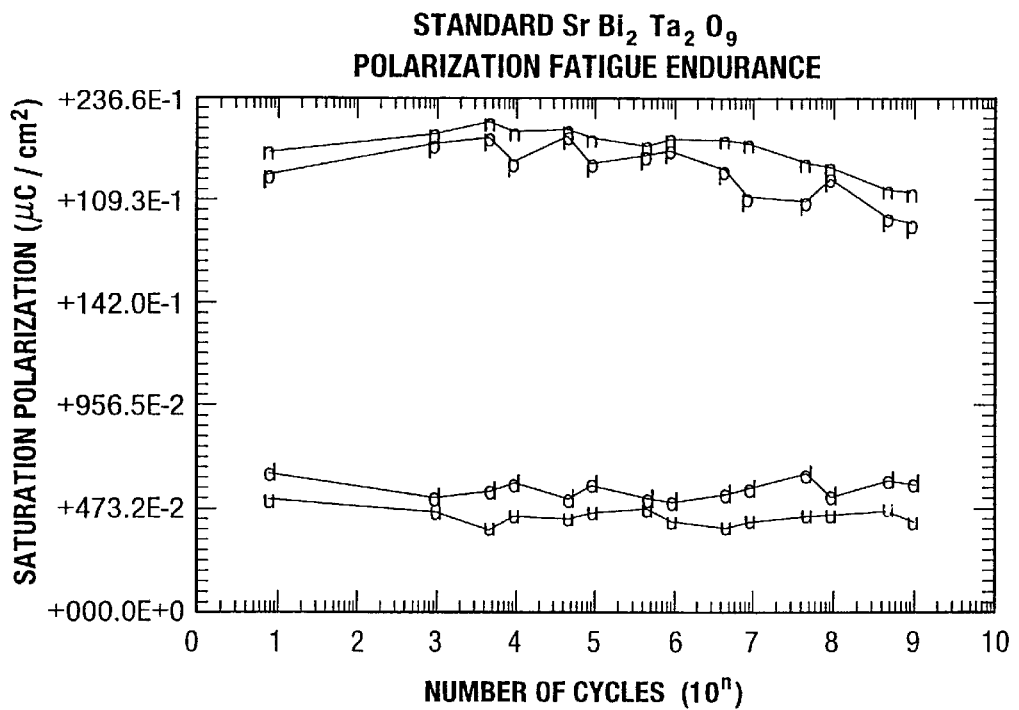
FIG. 23 is a graph of polarization fatigue values, plotted as saturation polarization versus switching cycles for PUND measurements that were obtained from a standard process strontium bismuth tantalate material.

PUND switching measurements were conducted for $10^9$ cycles on respective standard process and UV-treated c-axis oriented samples of $SrBi_2Ta_2O_9$ and $Sr_{0.909}Bi_2Ta_{1.909}O_{8.682}$ materials. FIG. 23 is a graph in which saturation polarization, in $\mu C/cm^2$, is plotted versus a logarithmic scale of switching cycles, and depicts data that was obtained from the standard process $SrBi_2Ta_2O_9$ sample. The four curves are labeled with p, u, n, or d to denote the corresponding portion of the PUND switching cycle from which the respective curves derive. The p and n curves exhibit substantial declines of 12% and 7%, respectively, over $10^9$ cycles. This level of fatigue indicates that the polarization of the standard process sample is extremely unstable under the switching conditions, and would be unsuitable for use in a ferroelectric FET memory if these conditions would prevail in the intended environment of use.

Figure 24:
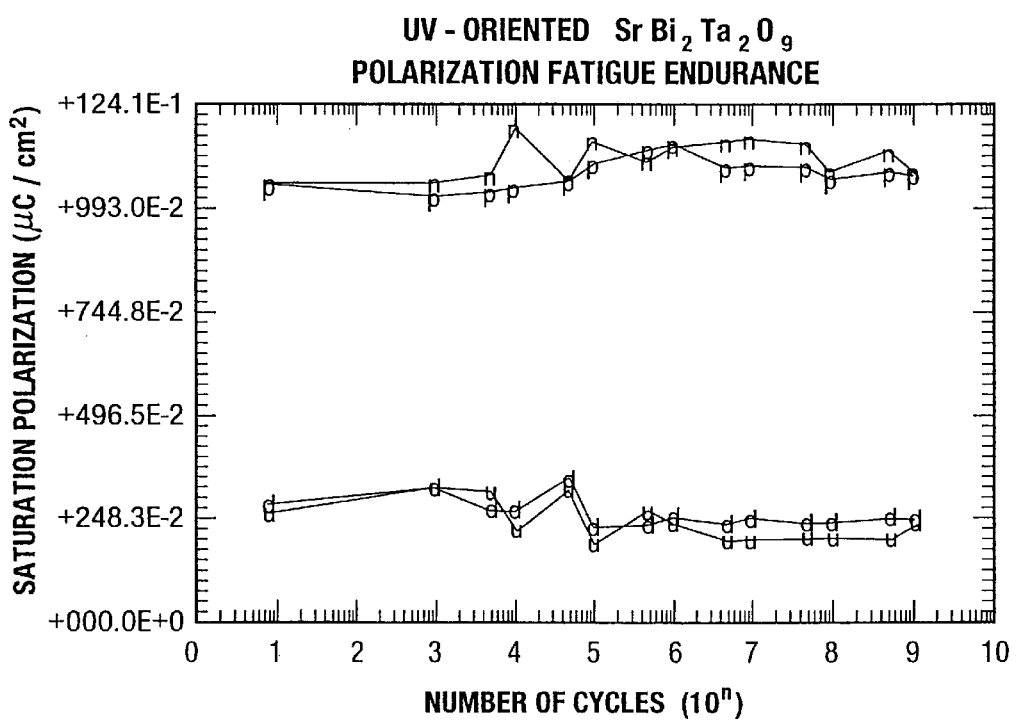
FIG. 24 is a graph similar to that of FIG. 23, but presents polarization fatigue endurance data obtained from PUND measurements of a UV-treated c-axis oriented sample having the same stoichiometry as the sample of FIG. 23.

FIG. 24 is a fatigue endurance plot like that of FIG. 23, but depicts results that were obtained from the UV-treated c-axis oriented $SrBi_2Ta_2O_9$ sample. FIG. 24 indicates that essentially no fatigue occurred in the UV-treated c-axis oriented sample over $10^9$ cycles. Accordingly, the UV-treated c-axis oriented sample would be suitable for use in a ferroelectric FET.

Figure 25:
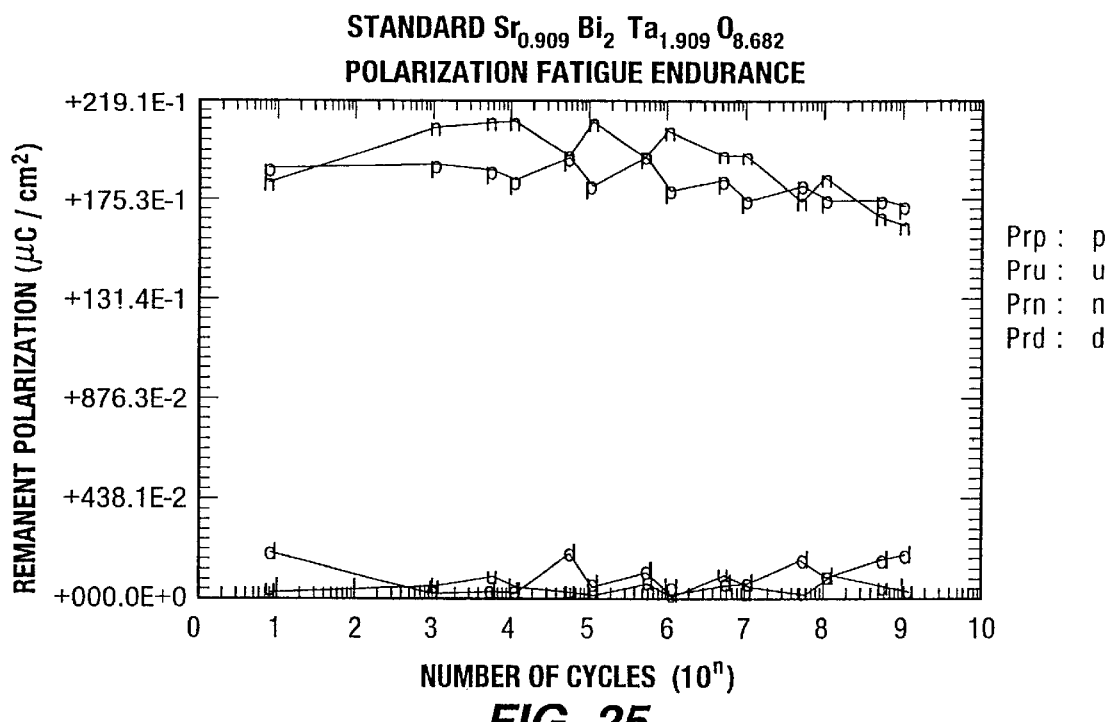
FIG. 25 is a graph similar to that of FIGS. 23 and 24, but includes fatigue endurance data obtained from PUND measurements of a standard process strontium bismuth tantalate material having a different stoichiometry than the samples of FIGS. 23 and 24.

FIG. 25 is a graph like that of FIGS. 23 and 24, but depicts results that were obtained from a standard process $Sr_{0.909}Bi_2Ta_{1.909}O_{8.682}$ sample. The p curve exhibited an approximate 11% decline and the n curve a 14% decline over $10^9$ cycles. This material, accordingly, would not be suitable for use as ferroelectric FET memory material under the prevailing conditions.

Figure 26:
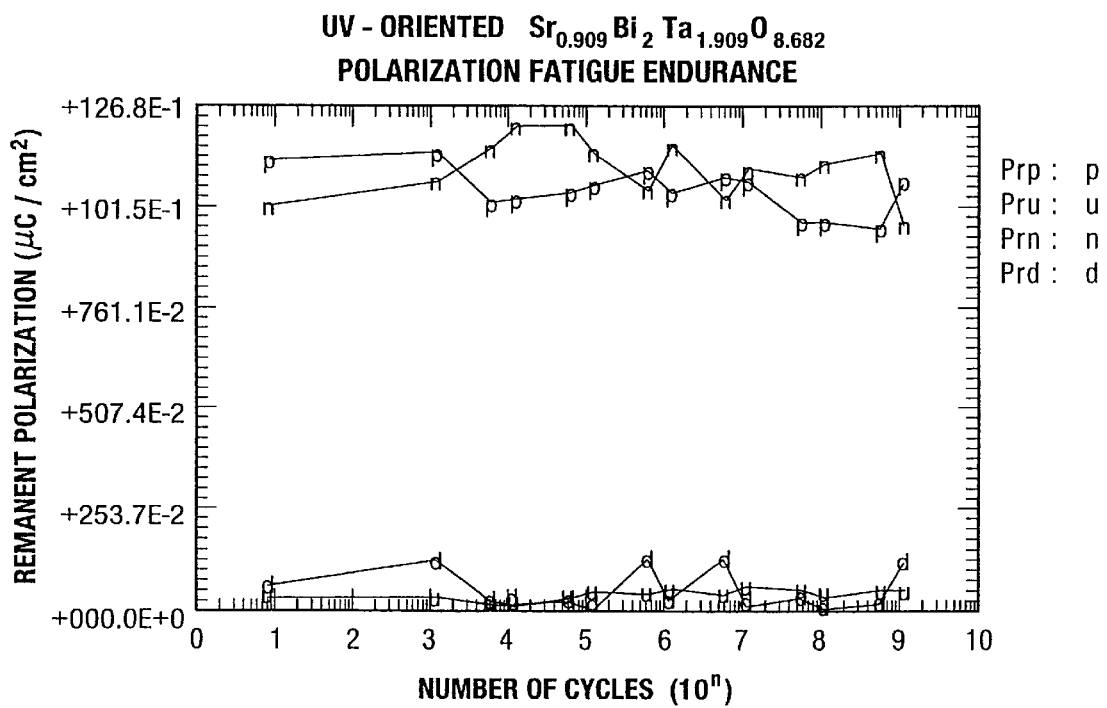
FIG. 26 is a graph similar to that of FIGS. 23 and 24, but includes fatigue endurance data obtained from PUND measurements of a UV-treated c-axis oriented sample having the same stoichiometry as that of the sample of FIG. 25.

FIG. 26 is a graph like that of FIGS. 23, 24, and 25, but depicts data obtained from the UV-treated c-axis oriented $Sr_{0.909}Bi_2Ta_{1.909}O_{8.682}$ sample. The p and n curves exhibit substantially no fatigue within the limits of experimental accuracy over the cycle interval studied. Accordingly, this material would be suitable for use as a memory under the prevailing conditions.

The results of Examples 1–5 show that c-axis orientation of the strontium bismuth tantalate layered superlattice material is associated with low dielectric constant values, good polarizability, good coercive field values, and good resistance to fatigue.

Figure 27:
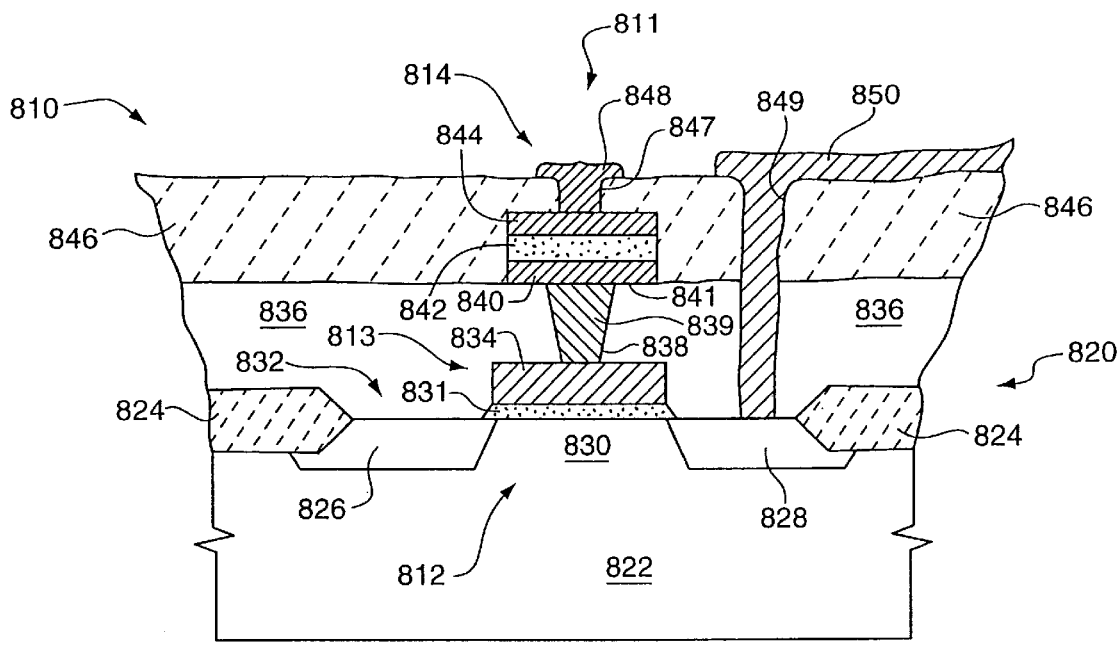
FIG. 27 shows a cross-sectional view of a portion of a ferroelectric FET memory having a thin film of crystallographically oriented ferroelectric material in accordance with an alternative embodiment of the invention.

FIG. 27 shows a cross-sectional view of a portion of a ferroelectric MFM-MIS FET memory 810 according to an alternative embodiment of the invention. The MFM-MIS FET memory 810 comprises a field effect transistor ("FET") 812 and a metal-ferroelectric-metal ("MFM") capacitor 814. FET 812 and MFM 814 are physically similar to memory cell structures of the prior art and can be manufactured using standard techniques for manufacturing MOSFETs and FeRAMs. The MFM-MIS FET memory 810 is formed on a wafer 820, comprising a standard semiconductor material 822, preferably p-100 crystalline silicon. A semiconductor substrate 832 comprises those elements of the memory cell that are formed from semiconductor material 822 of wafer 820. A field oxide layer 824, typically thermally oxidized silicon oxide, is formed in semiconductor substrate 832 using conventional techniques. Semiconductor substrate 832 also comprises a highly doped source region 826 and a highly doped drain region 828, which are formed about channel region 830 using conventional techniques. Doped source region 826 and drain region 828 are preferably n-type doped regions. Semiconductor oxide layer 831 is located above channel region 830, and gate electrode 834 is located above semiconductor oxide layer 831. Gate electrode 834 is disposed between semiconductor substrate 832 and ferroelectric MFM capacitor 814. Semiconductor substrate 832 comprises semiconductor material 822, source region 826, drain region 828, channel region 830, and semiconductor oxide layer 831. FET 812 comprises source region 826, drain region 828, channel region 830, semiconductor oxide layer 831 and gate electrode 834. FET 812 is covered by a standard interlayer dielectric ("ILD") 836, comprising a glasseous oxide, preferably a boron-doped phosphosilicate glass ("BPSG"). A via 838 from the top surface of gate electrode 834 through to the top of ILD 836 is filled with conductive plug 839. Conductive plug 839 typically comprises polycrystalline silicon or tungsten, preferably silicon. A bottom electrode 840 having a bottom surface 841 is located on ILD 836, covering conductive plug 839. Conductive plug 839 electrically connects gate electrode 834 to bottom surface 841 of bottom electrode 840. A thin film 842 of crystallographically oriented ferroelectric material in accordance with the invention is located on bottom electrode 840, and top electrode 844 is located on ferroelectric thin film 842. Ferroelectric thin film 842 preferably comprises c-axis oriented layered superlattice material, such as strontium bismuth tantalum niobate. Bottom electrode 840, ferroelectric thin film 842 and top electrode 844 together form ferroelectric MFM capacitor 814. A second interlayerdielectric, ILD 846, covers ILD 836 and MFM 814. A wiring hole 847 extends through ILD 846 to top electrode 844. Local interconnect 848 filling wiring hole 847 connects top electrode 844 electrically to a write-voltage. A wiring hole 849 extends through ILD 846 and ILD 836 to drain region 828. Local interconnect 850 fills wiring hole 849 and electrically connects drain region 828 to a read-voltage and a source-to-drain current sensor (not shown).

In a variation of the embodiment of FIG. 27, an additional insulator layer is located on semiconductor oxide layer 831 between gate electrode 834 and semiconductor substrate 830. The additional insulator layer typically comprises a dielectric metal oxide, such as $CeO_2$, $ZrO_2$, $Y_2O_3$, $(Ce_{1-x}Zr_x)O_2$, where $0 \leq x \leq 1$, preferably $(Ce_{0.1}Zr_{0.9})O_2$, but it may also be any dielectric material that is compatible with the other integrated circuit materials.

Figure 28:
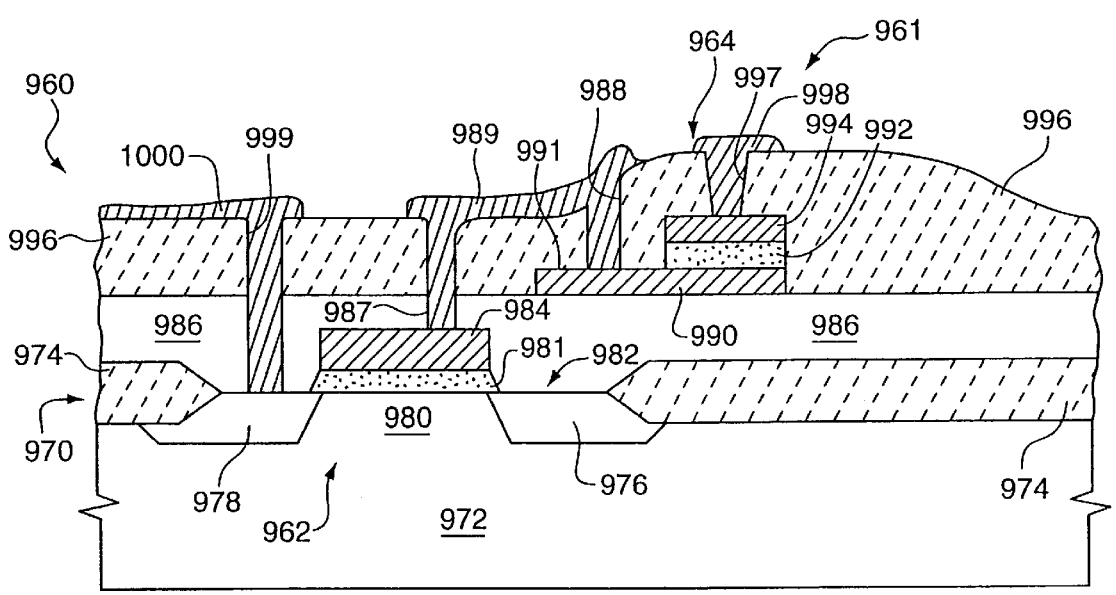
FIG. 28 shows a cross-sectional view of a portion of a ferroelectric FET memory having a thin film of crystallographically oriented ferroelectric material in accordance with a further alternative embodiment of the invention.

A further alternative embodiment of the invention is depicted in FIG. 28. In FIG. 28, ferroelectric MFM-MIS FET memory 960 comprises FET 962 and MFM capacitor 964. MFM capacitor 964 is displaced laterally with respect to FET 962, instead of being substantially directly above the gate of FET 962. The structure of memory 960 is physically similar to memory cell structures of the prior art, and may be manufactured using conventional processes applied to standard MOSFETs and FeRAMs. The MFM-MIS FET memory 960 is formed on a wafer 970, comprising standard semiconductor material 972, preferably p-100 crystalline silicon. A semiconductor substrate 982 comprises those elements of the memory cell that are formed from semiconductor material 972 of wafer 970. A field oxide layer 974, typically thermally oxidized silicon oxide, is formed from semiconductor material 972. A source region 976 and a drain region 978 are formed about a channel region 980. Semiconductor oxide layer 981 is located above channel region 980, and gate electrode 984 is located above semiconductor oxide layer 981. Gate electrode 984 is disposed between semiconductor substrate 982 and ferroelectric MFM capacitor 964. Semiconductor substrate 982 comprises semiconductor material 972, source region 976, drain region 978, channel region 980, and semiconductor oxide layer 981. FET 962 comprises source region 976, drain region 978, channel region 980, semiconductor oxide layer 981 and gate electrode 984 together. FET 962 is covered by a first interlayer dielectric ("ILD") 986, comprising a glasseous oxide, preferably a boron-doped phosphosilicate glass ("BPSG"). A bottom electrode 990 having an upper surface 991 is located on ILD 986. A thin film 992 of crystallographically oriented ferroelectric material, in accordance with the invention, is located on a portion of bottom electrode 990, and top electrode 994 is located on ferroelectric thin film 992. Ferroelectric thin film 992 preferably comprises c-axis oriented layered superlattice material, such as strontium bismuth tantalum niobate. Bottom electrode 990, ferroelectric thin film 992 and top electrode 994 together form MFM capacitor 964. A second interlayerdielectric, ILD 996, covers ILD 986 and MFM capacitor 964. A wiring hole 987 extends through ILD 96 and ILD 986 to gate electrode 984. Wiring hole 988 extends through ILD 996 to upper surface 991 of bottom electrode 990. Local interconnect 989 fills wiring holes 987 and 988 and electrically connects gate electrode 984 and bottom electrode 990. A wiring hole 997 extends through ILD 996 to top electrode 994. Local interconnect 998 fills wiring hole 997, electrically connecting top electrode 994 to a write-voltage (not shown). Alternatively (not shown), the gate electrode could be connected to the top electrode of a MFM capacitor, and the write-voltage could be applied to the bottom electrode. A wiring hole 999 extends through ILD 996 and ILD 986 to drain region 978. Local interconnect 1000 fills wiring hole 998 and electrically connects drain region 978 to a read-voltage and a source-to-drain current sensor (not shown).

In a variation of the embodiment of FIG. 28, an additional insulator layer comprising dielectric material is located on semiconductor oxide layer 981 between gate electrode 984 and semiconductor substrate 982.

There has been described an integrated circuit NDRO ferroelectric FET memory device having a polycrystalline crystallographically oriented ferroelectric thin film. The device is especially useful because it provides a ferroelectric FET memory having a lower switching voltage, higher fatigue resistance, lower leakage current, and higher resistance to low voltage interference than conventional ferroelectric FETs. Before the invention, it was not known that a crystallographically oriented ferroelectric layer having good electronic characteristics could be used in the structure of a ferroelectric FET memory. There has also been described a method of forming a ferroelectric FET in accordance with the invention using UV radiation. It should be understood that the particular embodiments shown in the drawings and described within this specification are for purposes of example and should not be construed to limit the invention which will be described in the claims below. For example, the invention contemplates that the crystallographically oriented ferroelectric layer may comprise a wide range of ferroelectric materials that can be deposited and crystallographically oriented using a wide range of techniques. Further, it is evident that those skilled in the art may now make numerous uses and modifications of the specific embodiments described, without departing from the inventive concepts. For example, the preferred device structure, ferroelectric thin film composition, or preferred fabrication method may be altered without departing from the invention.

Consequently, the invention is to be construed as embracing each and every novel feature and novel combination of features present in and/or possessed by the devices, fabrication processes, compositions, electronic devices, and electronic device manufacturing methods described.

What is claimed is:

1. A method of fabricating a ferroelectric FET comprising:
   preparing a semiconductor substrate;
   forming a gate electrode; and
   forming a thin film of polycrystalline crystallographically oriented ferroelectric material located between said semiconductor substrate and said gate electrode,
   wherein said step of forming said thin film of polycrystalline crystallographically oriented ferroelectric material comprises:
   providing a liquid precursor containing a plurality of metal moieties in effective amounts for yielding said ferroelectric material upon annealing of said precursor;
   forming said thin film of ferroelectric material on said substrate utilizing said liquid precursor; and
   during said step of forming, irradiating one of said liquid precursor or said forming thin film with ultraviolet radiation of sufficient intensity to alter electrical properties in said thin film.

2. A method of fabricating a ferroelectric FET as in claim 1 wherein said preparing said semiconductor substrate comprises forming a source, a drain and a channel region in said semiconductor substrate, said channel region located between said source and said drain, and said thin film of polycrystalline crystallographically oriented ferroelectric material is formed between said channel region and said gate electrode.

3. A method of fabricating a ferroelectric FET as in claim 1 wherein said thin film of polycrystalline crystallographically oriented ferroelectric material comprises c-axis oriented metal oxide material.

4. A method of fabricating a ferroelectric FET as in claim 3 wherein said c-axis oriented metal oxide material is c-axis oriented perovskite material.

5. A method of fabricating a ferroelectric FET as in claim 3 wherein said c-axis oriented metal oxide material is c-axis oriented layered superlattice material.

6. A method of fabricating a ferroelectric FET as in claim 5 wherein said c-axis oriented layered superlattice material contains metal atoms in relative molar proportions corresponding to a stoichiometric formula $Sr_a Bi_b (Ta_c Nb_d) O_{[9+(a-1)+(b-2)(1.5)+(c+d-2)(2.5)]}$, where $0.8 \leq a \leq 1$, $2 \leq b > 2.3$, and $1.8 \leq (c+d) \leq 2.3$.

7. The method as in claim 5 wherein said step of forming includes steps of:
   providing a liquid precursor containing a plurality of metal moieties in effective amounts for yielding a layered superlattice material upon heating of said precursor;
   applying said liquid precursor onto said substrate to form a liquid thin film on said substrate;
   drying said liquid thin film on said substrate under conditions sufficient to form a dried thin film;
   exposing at least one of said precursor, said liquid thin film, and said dried thin film to ultraviolet radiation having an intensity sufficient to alter electrical properties in said layered superlattice material; and
   thereafter annealing said dried thin-film.

8. A method of fabricating a ferroelectric FET as in claim 1 wherein said thin film of polycrystalline crystallographically oriented ferroelectric material has a thickness in the range of from 20 nm to 600 nm.

9. A method of fabricating a ferroelectric FET as in claim 1 wherein said thin film of polycrystalline crystallographically oriented ferroelectric material has a thickness in the range of from 40 nm to 400 nm.

10. A method of fabricating a ferroelectric FET as in claim 1 wherein said thin film of polycrystalline crystallographically oriented ferroelectric material has a thickness in the range of from 40 nm to 250 nm.

11. A method of fabricating a ferroelectric FET as in claim 1, further comprising forming an interface insulator layer, wherein said interface insulator layer is formed between said semiconductor substrate and said thin film of polycrystalline crystallographically oriented ferroelectric material.

12. A method of fabricating a ferroelectric FET as in claim 11 wherein said interface insulator layer is formed directly on said semiconductor substrate.

13. A method of fabricating a ferroelectric FET as in claim 11 wherein said ferroelectric thin film is formed directly on said interface insulator layer.

14. A method of fabricating a ferroelectric FET as in claim 1 wherein said semiconductor substrate comprises a semiconductor oxide layer.

15. A method of fabricating a ferroelectric FET as in claim 14 and further including an interface insulator layer formed on said semiconductor oxide layer.

16. The method as in claim 1 wherein said ultraviolet radiation is of a wavelength of from about 180 nm to about 300 nm.

17. The method as in claim 16 wherein said ultraviolet radiation has an intensity of at least about 9 mW/cm² at 220 nm and 15 mW/cm² at 260 nm.

18. The method as in claim 1 wherein said providing step includes a step of supplying said precursor as a polyoxyalkylated metal complex.

19. The method as in claim 1 wherein said providing step includes a step of mixing said metal moieties in said effective amounts to form a layered superlattice material as said ferroelectric thin film.

20. The method as in claim 19 wherein said layered superlattice material is a mixed layered superlattice material.

21. The method as in claim 19 wherein said layered superlattice material includes strontium bismuth tantalate.

22. The method as in claim 19 wherein said layered superlattice material comprises strontium bismuth niobium tantalate.

23. The method as in claim 1 wherein said step of forming comprises:
applying said liquid precursor onto said substrate to form a liquid thin film on said substrate;
treating said liquid thin film on said substrate to form said ferroelectric thin film.

24. The method as in claim 23 wherein said irradiating step comprises exposing said liquid precursor to said ultraviolet radiation.

25. The method as in claim 23 wherein said step of treating comprises heating.

26. The method as in claim 25 wherein said step of heating comprises a step of baking said thin film at a temperature ranging from about 120° C. to about 500° C. and an irradiating step is performed simultaneously with said step of baking.

27. The method as in claim 26 wherein said step of baking is performed at about 400° C. for at least about 2 minutes in air.

28. The method as in claim 23 wherein said treating step includes a first baking of said thin film at a temperature ranging from 120° C. to 500° C. to form a solid thin film, and thereafter performing said step of irradiating.

29. The method as in claim 28 wherein said first baking is conducted at a temperature ranging from 120° C. to 160° C. in dry nitrogen or air.

30. The method as in claim 29 wherein said treating step further comprises a second baking step at a temperature ranging from about 240° C. to 280° C. after said step of irradiating.

31. The method as in claim 30 wherein said irradiating step further includes a step of exposing said solid thin film to said ultraviolet radiation after said second baking step.

32. A method as in claim 1 wherein said step of forming said thin film of ferroelectric material on said substrate utilizing said -liquid precursor comprises misted deposition.

33. A method as in claim 1 wherein said step of forming said thin film of ferroelectric material on said substrate utilizing said liquid precursor comprises chemical vapor deposition.

34. A method as in claim 1 wherein said step of forming said thin film of ferroelectric material on said substrate utilizing said liquid precursor comprises a spin-on process.

* * * * *